United States Patent
Suzuki

(10) Patent No.: US 7,656,195 B2
(45) Date of Patent: Feb. 2, 2010

(54) LATCH CIRCUIT, FLIP-FLOP CIRCUIT INCLUDING THE SAME, AND LOGIC CIRCUIT

(75) Inventor: Koichi Suzuki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/003,369

(22) Filed: Dec. 21, 2007

(65) Prior Publication Data

US 2008/0157814 A1    Jul. 3, 2008

(30) Foreign Application Priority Data

Dec. 28, 2006  (JP) ............................. 2006-356142

(51) Int. Cl.
G06F 7/38       (2006.01)
H03K 19/173   (2006.01)

(52) U.S. Cl. ......................... 326/46; 712/232
(58) Field of Classification Search ................... 326/46; 712/232

See application file for complete search history.

(56) References Cited

U.S. PATENT DOCUMENTS

| | | | | |
|---|---|---|---|---|
| 5,905,393 A | * | 5/1999 | Rinderknecht et al. | 327/202 |
| 6,850,103 B2 | * | 2/2005 | Ikeno et al. | 327/202 |
| 7,088,136 B1 | * | 8/2006 | Lewis | 326/46 |
| 7,183,825 B2 | * | 2/2007 | Padhye et al. | 327/202 |
| 7,292,672 B2 | * | 11/2007 | Isono | 377/64 |

FOREIGN PATENT DOCUMENTS

| JP | 01-192212 A | 8/1989 |
|---|---|---|
| JP | 04-070003 A | 3/1992 |

* cited by examiner

Primary Examiner—Vibol Tan
Assistant Examiner—Dylan White
(74) Attorney, Agent, or Firm—Arent Fox LLP

(57) ABSTRACT

Disclosed herein is a latch circuit including a switching circuit for switching output/non-output of an externally inputted external signal based on a predetermined control signal, a state retaining circuit for inputting a signal outputted from the switching circuit as an input signal, and retaining the state of the logical level of an output signal that is outputted based on the input signal, and a clear circuit for changing the logical level of the input signal to a clear level based on a clear signal.

5 Claims, 20 Drawing Sheets

Related Art

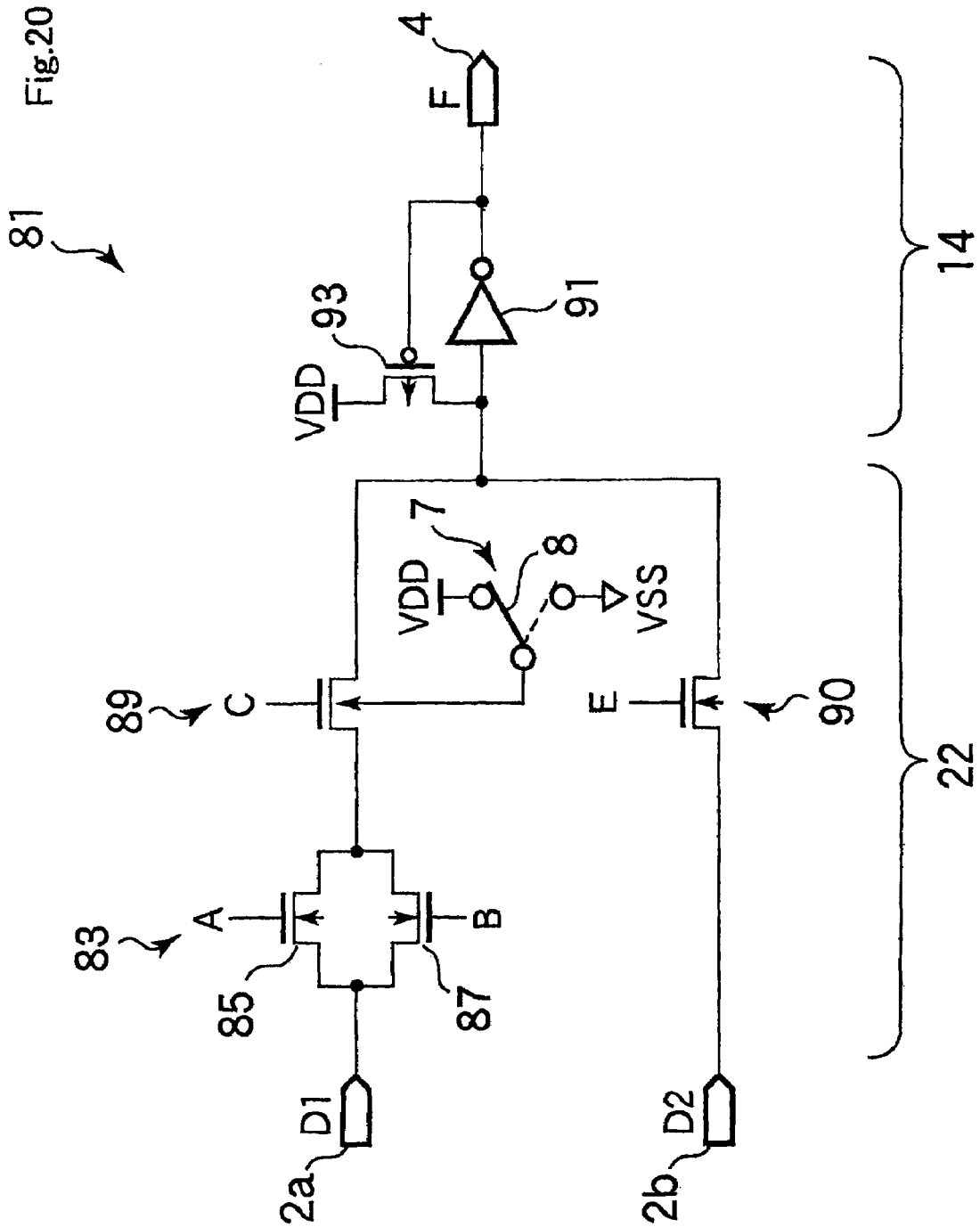

LATCH CIRCUIT, FLIP-FLOP CIRCUIT INCLUDING THE SAME, AND LOGIC CIRCUIT

CROSS-REFERENCE TO RELATED APPLICATIONS

This application is based upon and claims the benefit of priority from prior Japanese Patent Application No. 2006-356142 filed on Dec. 28, 2006, the entire contents of which are incorporated herein by reference.

BACKGROUND

1. Field

The embodiments discussed herein are directed to a latch circuit having a clear function capable of clearing an output signal without being depended on by an externally inputted external signal, a flip-flop circuit including the latch circuit, and a logic circuit.

2. Description of the Related Art

FIG. 1 shows a circuit configuration of a conventional D flip-flop (DFF) circuit 101. As shown in FIG. 1, the DFF circuit 101 includes: a master circuit 110 disposed on the input-side and which constitutes a D latch circuit; and a slave circuit 112 disposed on the output-side and which constitutes a D latch circuit. The master circuit 110 has an input terminal connected to an input section 102 to which an external signal D is externally inputted and an output terminal connected to the input terminal of the slave circuit 112. The output terminal of the slave circuit 112 is connected to an output section 104 from which an output signal Q is outputted.

The master circuit 110 includes: a gated inverter circuit 103 whose input terminal is connected to the input section 102; and a state retaining circuit 106 whose input terminal is connected to the output terminal of the gated inverter circuit 103 and whose output terminal becomes the output terminal of the master circuit 110. The gated inverter circuit 103 is arranged so that output/non-output of a first inversion signal whose phase is inverted by 180 degrees with respect to the external signal D is switchable based on clock signals CLK, CLKX as control signals.

The state retaining circuit 106 includes an inverter circuit 105 and a gated inverter circuit 107. The first inversion signal is inputted from the gated inverter circuit 103 to the inverter circuit 105. In addition, the inverter circuit 105 is arranged to output a second inversion signal whose phase is inverted by 180 degrees with respect to the first inversion signal to the gated inverter circuit 107 and the slave circuit 112. The gated inverter circuit 107 is arranged so that output/non-output of a third inversion signal whose phase is inverted by 180 degrees with respect to the second inversion signal is switchable based on the clock signals CLK, CLKX.

The gated inverter circuit 107 operates so as to non-output/output the third inversion signal in synchronization with the output/non-output of the gated inverter circuit 103. Therefore, when the gated inverter circuit 103 is in a non-output state, the gated inverter circuit 107 connects a signal retaining path linking the input and output terminals of the inverter circuit 105. As a result, a latch loop is formed by the inverter circuit 105 and the gated inverter circuit 107 within the state retaining circuit 106. The first inversion signal inputted to the inverter circuit 105 and the third inversion signal outputted by the gated inverter circuit 107 are in phase with each other. Therefore, the state retaining circuit 106 continues to retain the state of the logical level of the second inversion signal as long as the latch loop is formed and the gated inverter circuit 103 is in a non-output state.

As shown in FIG. 1, the configuration of the slave circuit 112 is similar to that of the master circuit 110. The slave circuit 112 includes a gated inverter circuit 109 and a state retaining circuit 108. The gated inverter circuit 109 corresponds to the gated inverter circuit 103 of the master circuit 110, while the state retaining circuit 108 corresponds to the state retaining circuit 106 of the master circuit 110. The state retaining circuit 108 includes an inverter circuit 111 and a gated inverter circuit 113. The inverter circuit 111 corresponds to the inverter circuit 105 of the state retaining circuit 106. The gated inverter circuit 113 corresponds to the gated inverter circuit 107 of the state retaining circuit 106.

The second inversion signal outputted from the master circuit 110 is inputted to the gated inverter circuit 109. The inverter circuit 111 outputs a fourth inversion signal whose phase is inverted by 180 degrees with respect to the second inversion signal to the output section 104. The fourth inversion signal becomes the output signal Q.

FIG. 2 shows a circuit configuration of a conventional clear function-added DFF circuit 201. As shown in FIG. 2, the clear function-added DFF circuit 201 includes NOR circuits 115 and 117, having one of the respective terminals thereof connected to a clear input section 116 to which a clear signal CLR is inputted, in place of the inverter circuits 105 and 111 of the DFF circuit 101. When a high-level clear signal CLR is inputted, the clear function-added DFF circuit 201 is able to clear an output signal Q to a low level without being depended on by the logical level of an external signal D.

FIG. 3 shows a circuit configuration of a conventional clear function-added D latch circuit 301. As shown in FIG. 3, the clear function-added D latch circuit 301 includes: a gated inverter circuit 121 whose input terminal is connected to an input section 102 to which an external signal D is inputted; and a state retaining circuit 130 whose input terminal is connected to an output terminal of the gated inverter circuit 121 and whose output terminal is connected to an output section 104 from which an output signal Q is outputted. The state retaining circuit 130 includes a NOR circuit 123 having: one input terminal to which a clear signal CLR is inputted; another input terminal to which the output signal of the gated inverter circuit 121 is inputted; and an output terminal that becomes the output terminal of the state retaining circuit 130. The state retaining circuit 130 further includes a gated inverter circuit 125 having: an input terminal connected to the output terminal of the NOR circuit 123; and an output terminal connected to the input terminal of the NOR circuit 123.

The gated inverter circuit 121 includes p-type complimentary metal-oxide semiconductors (PMOSFETs) 131, 133 and n-type MOSFETs (NMOSFETs) 135, 137 connected in series between a power supply terminal to which a power supply voltage VDD is applied and a ground terminal that becomes a reference potential VSS. The external signal D is respectively inputted to gate terminals of the PMOSFET 131 and the NMOSFET 137. A clock signal CLK is inputted to a gate terminal of the PMOSFET 133. A clock signal CLKX is inputted to a gate terminal of the NMOSFET 135.

The NOR circuit 123 includes: PMOSFETs 141, 143 and an NMOSFET 145 connected in series between the power supply terminal and the ground terminal; and an NMOSFET 147 connected in parallel with the NMOSFET 145. The output signal of the gated inverter circuit 121 is respectively inputted to gate terminals of the PMOSFET 143 and the NMOSFET 145. The clear signal CLR is respectively inputted to gate terminals of the PMOSFET 141 and the NMOSFET 147.

The gated inverter circuit 125 includes PMOSFETs 151, 153 and NMOSFETs 155, 157 connected in series between the power supply terminal and the ground terminal. The output signal of the NOR circuit 123 is respectively inputted to gate terminals of the PMOSFET 151 and the NMOSFET 157. The clock signal CLKX is inputted to a gate terminal of the PMOSFET 153 while the clock signal CLK is inputted to a gate terminal of the NMOSFET 155.

At the clear function-added D latch circuit 301, when a high-level clear signal CLR is inputted, the PMOSFET 141 changes to an off-state and disconnects the connection between the power supply terminal and the output terminal of the NOR circuit 123, and the NMOSFET 147 changes to an on-state and connects the output terminal of the NOR circuit 123 with the ground terminal. As a result, the output signal Q is cleared to a low level without being depended on by the logical level of the external signal D.

FIG. 4 shows another circuit configuration of a conventional clear function-added DFF circuit 201. The clear function-added DFF circuit 201 shown in FIG. 4 includes: transfer gate circuits 161, 171 in place of the gated inverter circuits 103, 109 of the clear function-added DFF circuit 201 shown in FIG. 2; and NAND circuits 163, 173 respectively having one input terminal to which a clear signal CLR is inputted in place of the NOR circuits 115, 117. Furthermore, the clear function-added DFF circuit 201 shown in FIG. 4 includes: a transfer gate circuit 165 and an inverter circuit 167 in place of the gated inverter circuit 107 of the clear function-added DFF circuit 201 shown in FIG. 2; and a transfer gate circuit 175 and an inverter circuit 177 in place of the gated inverter circuit 113.

As shown in FIG. 4, output terminals of the NAND circuits 163, 173 are respectively connected to the input terminals of the inverter circuits 167, 177. Output terminals of the inverter circuits 167, 177 are respectively connected to input terminals of the transfer gate circuits 165, 175. Output terminals of the transfer gate circuits 165, 175 are respectively connected to the other input terminals of the NAND circuits 163, 173.

At the clear function-added DFF circuit 201, when a low-level clear signal CLR is inputted, the output signals of the NAND circuits 163, 173 assume a constant high logical level. As a result, the output signal Q may be cleared to a high level regardless of the logical level of the external signal D.

FIG. 5 shows another circuit configuration of a conventional clear function-added D latch circuit 301. The clear function-added D latch circuit 301 shown in FIG. 5 includes: a transfer gate circuit 181 in place of the gated inverter circuit 121 of the clear function-added D latch circuit 301 shown in FIG. 3; and a NAND circuit 183 having one input terminal to which a clear signal CLR is inputted in place of the NOR circuit 123. In addition, the clear function-added D latch circuit 301 shown in FIG. 5 includes a transfer gate circuit 185 and an inverter circuit 187 in place of the gated inverter circuit 125 of the clear function-added D latch circuit 301 shown in FIG. 3.

The transfer gate circuit 181 includes a PMOSFET 191 and an NMOSFET 193 connected in parallel. A clock signal CLK is inputted to the gate terminal of the PMOSFET 191, while a clock signal CLKX is inputted to the gate terminal of the NMOSFET 193. Source terminals of the PMOSFET 191 and the NMOSFET 193 are connected to each other, and an external signal D is inputted thereto. Drain terminals of the PMOSFET 191 and the NMOSFET 193 are connected to each other, and an output signal is outputted therefrom.

The NAND circuit 183 includes: a PMOSFET 213 and NMOSFETs 215, 217 connected in series between the power supply terminal and the ground terminal; and a PMOSFET 211 connected in parallel with the PMOSFET 213. The output signal of the transfer gate circuit 181 is respectively inputted to gate terminals of the PMOSFET 213 and the NMOSFET 215. The clear signal CLR is respectively inputted to gate terminals of the PMOSFET 211 and the NMOSFET 217.

The inverter circuit 187 includes a PMOSFET 221 and an NMOSFET 223 connected in series between the power supply terminal and the ground terminal. The output signal of the NAND circuit 183 is inputted to gate terminals of the PMOSFET 221 and the NMOSFET 223. An inversion signal is outputted from drain terminals of the PMOSFET 221 and the NMOSFET 223.

The transfer gate circuit 185 includes a PMOSFET 195 and an NMOSFET 197 connected in parallel. A clock signal CLKX is inputted to a gate terminal of the PMOSFET 195. A clock signal CLK is inputted to a gate terminal of the NMOSFET 197. Source terminals of the PMOSFET 195 and the NMOSFET 197 are mutually connected and are connected to the output terminal of the inverter circuit 187, while drain terminals thereof are mutually connected and are connected to the other input terminal of the NAND circuit 183.

At the clear function-added D latch circuit 301, when a low-level clear signal CLR is inputted, the NMOSFET 217 changes to an off-state and disconnects the connection between the ground terminal and the output terminal of the NOR circuit 123, and the PMOSFET 211 changes to an on-state and connects the output terminal of the NOR circuit 123 with the power supply terminal. As a result, an output signal Q is cleared to a high level without being depended on by the logical level of an external signal D.

SUMMARY

It is an aspect of the embodiments discussed herein to provide a latch circuit including a switching circuit for switching output/non-output of an externally inputted external signal based on a predetermined control signal, a state retaining circuit for inputting a signal outputted from the switching circuit as an input signal, and retaining the state of the logical level of an output signal that is outputted based on the input signal, and a clear circuit for changing the logical level of the input signal to a clear level based on a clear signal.

BRIEF DESCRIPTION OF THE DRAWINGS

FIG. 20 is a diagram showing an exemplary circuit configuration of a logic circuit 81 according to the present embodiment.

DETAILED DESCRIPTION OF THE EMBODIMENTS

Figure 1:
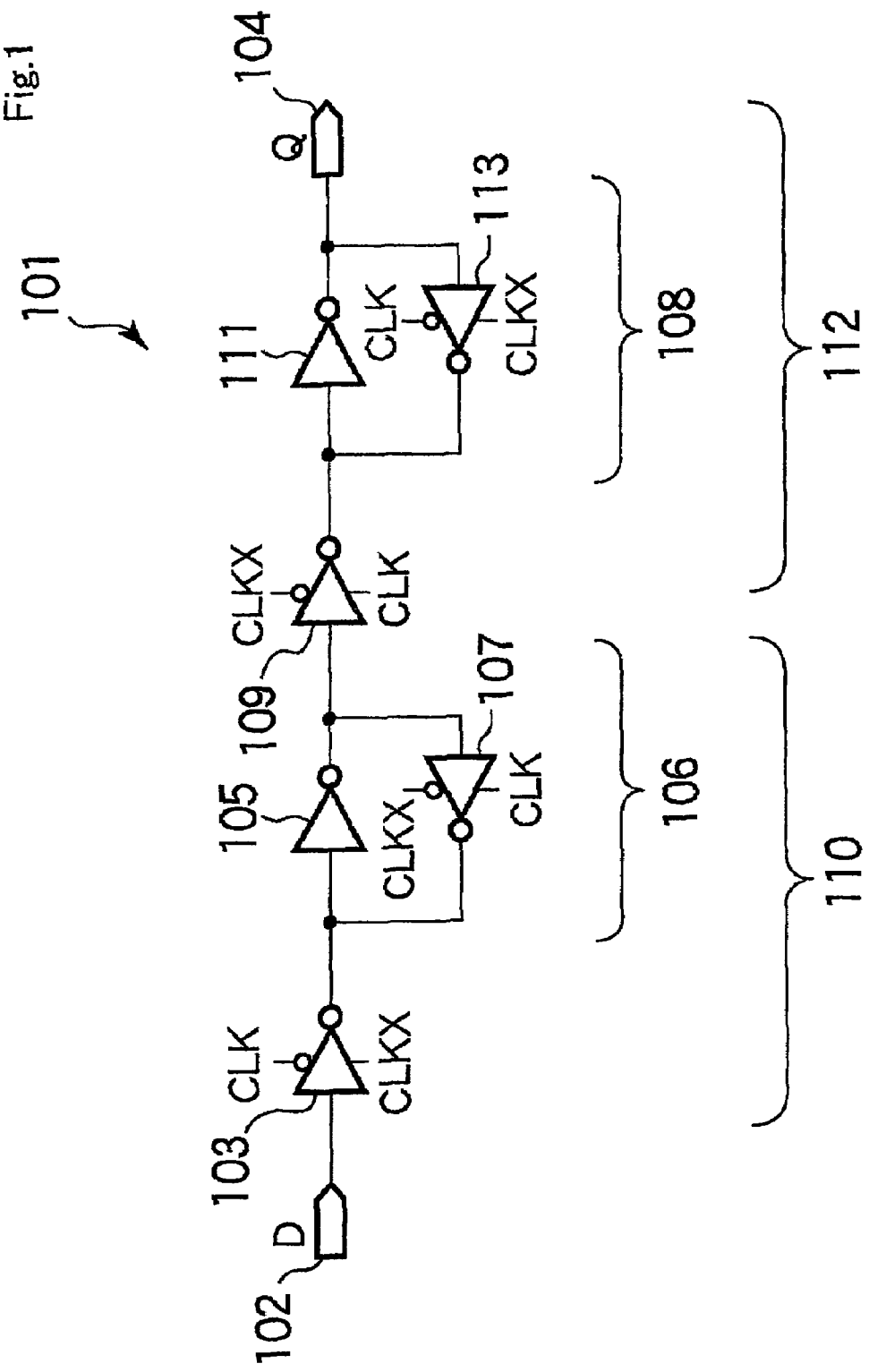
FIG. 1 is a diagram showing a circuit configuration of a conventional D flip-flop (DFF) circuit 101.
Figure 2:
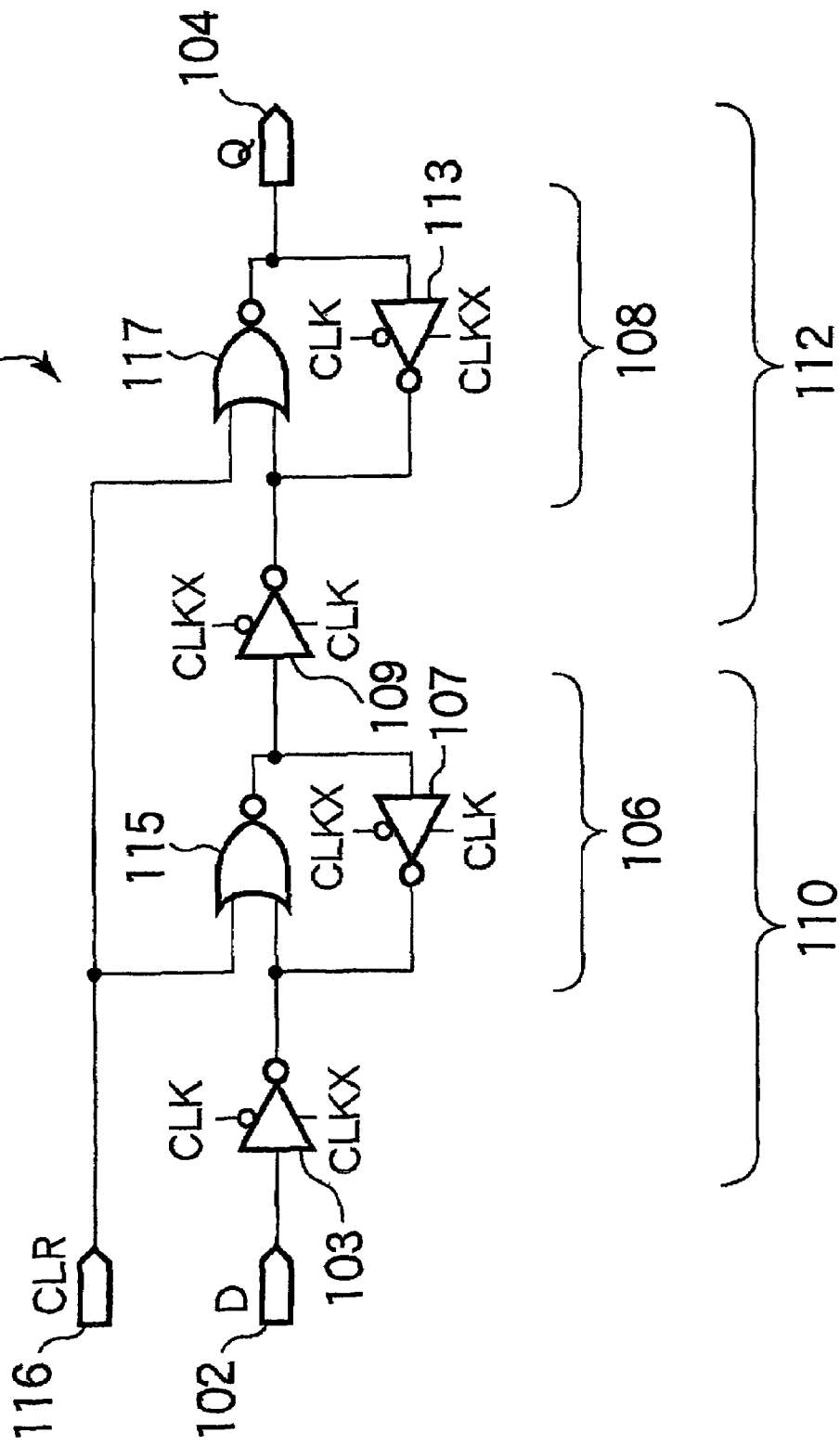
FIG. 2 is a diagram showing a circuit configuration of a conventional clear function-added DFF circuit 201.
Figure 3:
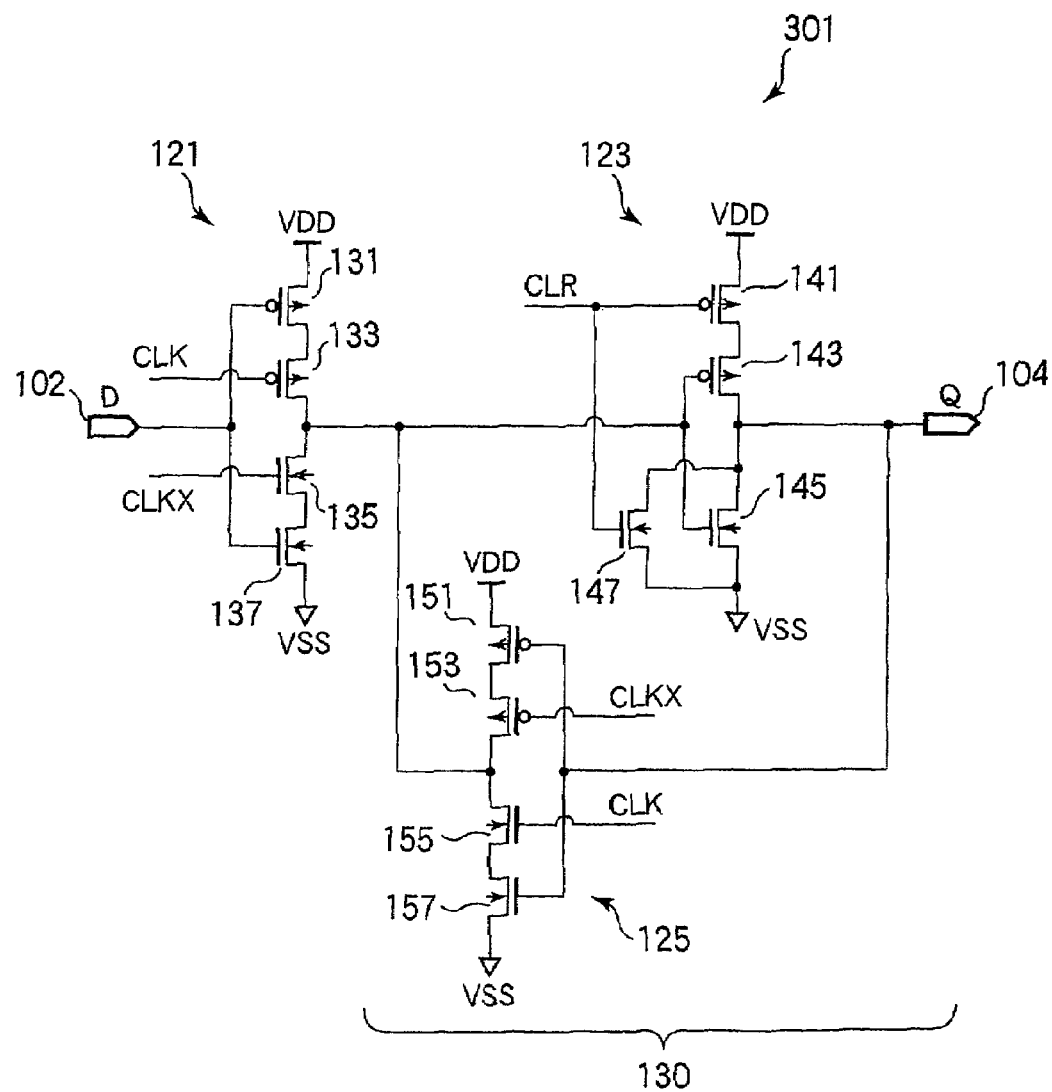
FIG. 3 is a diagram showing a circuit configuration of a conventional clear function-added D latch circuit 301.
Figure 4:
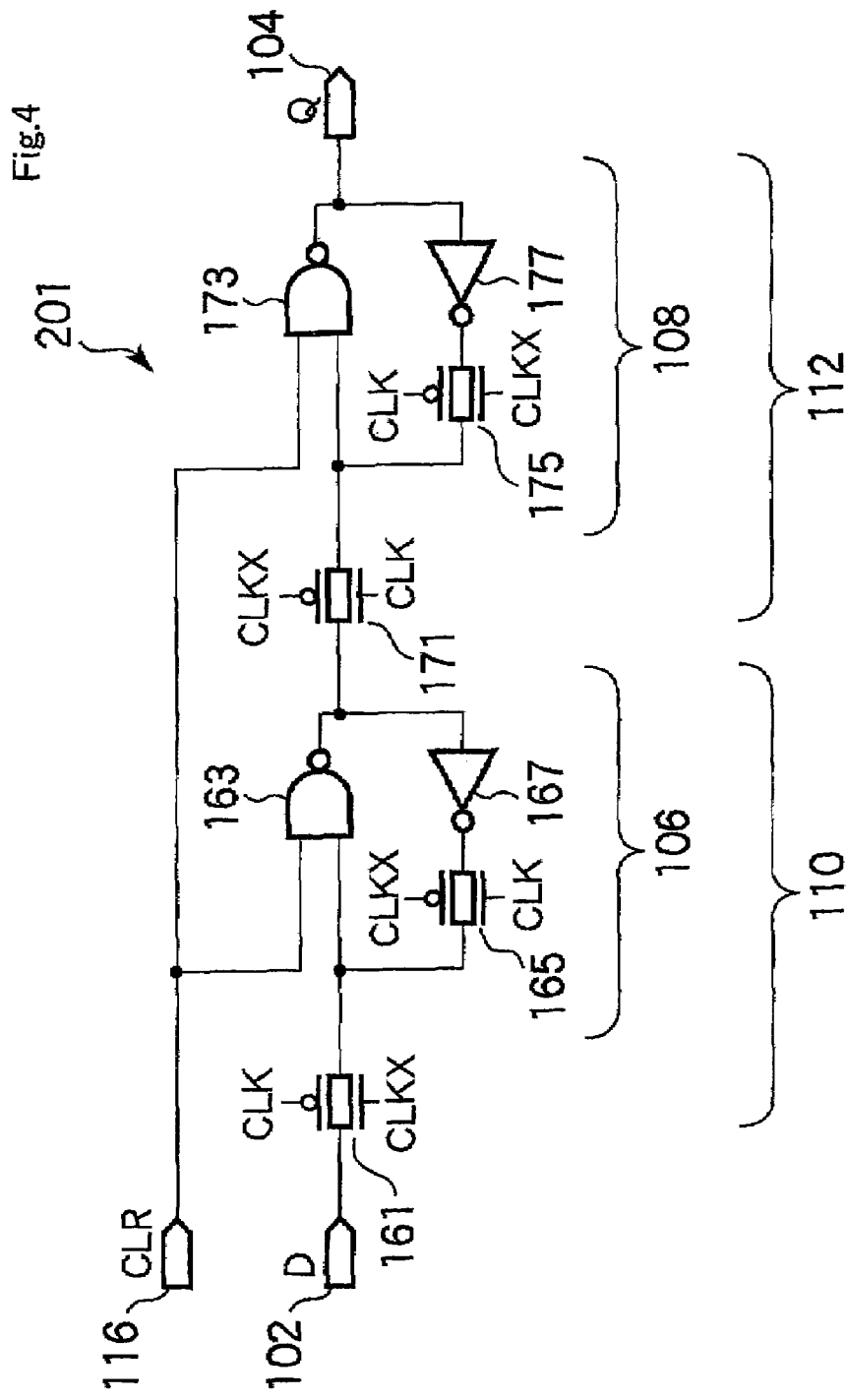
FIG. 4 is a diagram showing another circuit configuration of a conventional clear function-added DFF circuit 201.
Figure 5:
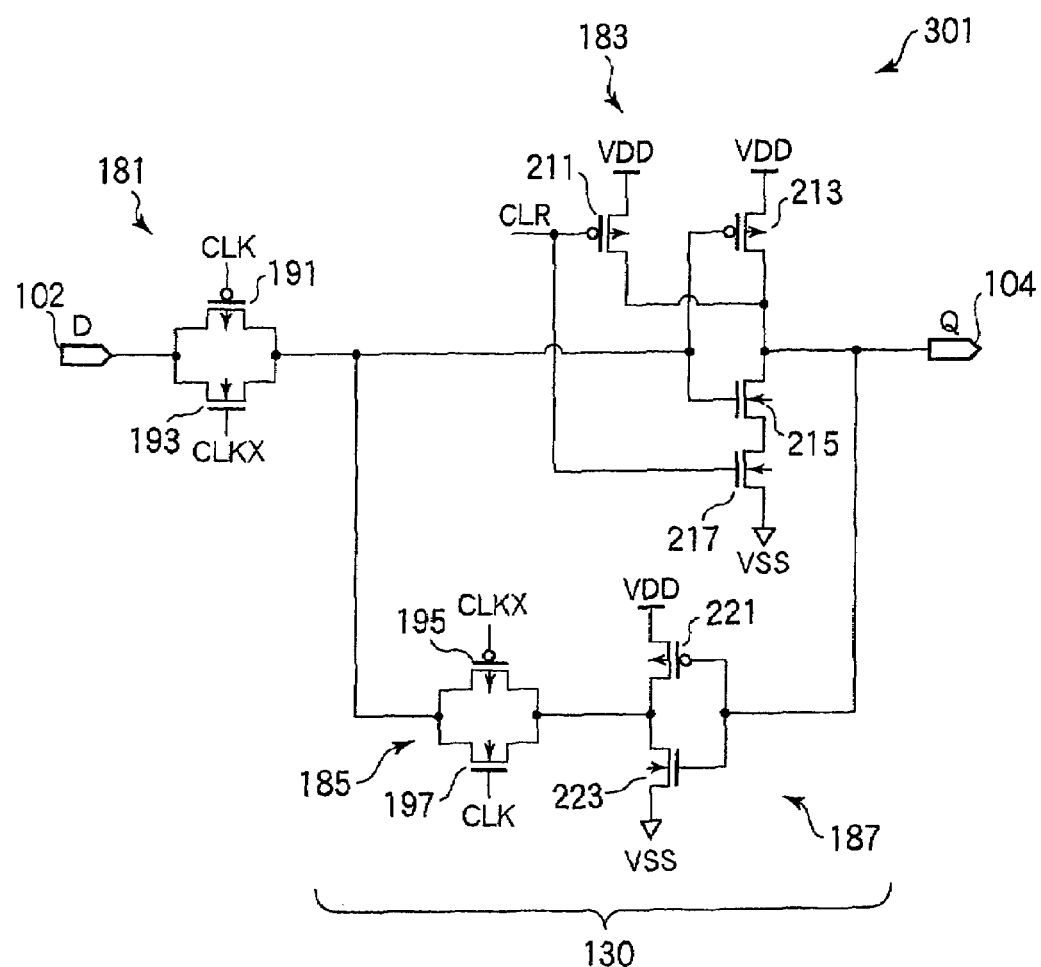
FIG. 5 is a diagram showing another circuit configuration of a conventional clear function-added D latch circuit 301.

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors, and so on. Additionally, while n-channel devices are used in the following examples, the same general approaches may also apply to circuits incorporating p-channel FETs or PNP bipolar transistors, for example.

Still further, while terms "drain" and "source" are used for ease of explanation and to adhere to traditional engineering usage, it should be recognized that a drain and source of a FET transistor may be considered interchangeable, and for the following descriptions merely thought of as a first end and a second end of a semiconductor channel unless otherwise stated or apparent to one of ordinary skill in the art.

As shown in FIGS. 2 to 5, for the purpose of clearing an output signal Q, state retaining circuits 106, 108 and 130 are provided with NOR circuits 115, 117, 123 and NAND circuits 163, 173, 183 on signal paths on which inputted signals are transmitted from an input terminal to an output terminal. Compared to an inverter circuit, a logic circuit such as a NOR circuit or a NAND circuit includes more FETs. Accordingly, a relatively large load is applied to a wiring to which a NOR circuit, a NAND circuit or the like is connected. Therefore, in a clear function-added DFF circuit 201 and a clear function-added D latch circuit 301, the load on a signal path is increased in comparison to a DFF circuit 101 that does not have a clear function.

With the clear function-added DFF circuit 201 and the clear function-added D latch circuit 301, even during a normal operation when a clearing operation is not performed, excess loads are applied to signal paths that require high-speed operations. As a result, a problem arises in that the high-speed operations of the clear function-added DFF circuit 201 and the clear function-added D latch circuit 301 are impaired.

A primary object of the present embodiment is to provide a latch circuit having a clear function for clearing output signals and which is capable of high-speed operations, a flip-flop circuit including the latch circuit, and a logic circuit.

Figure 6:
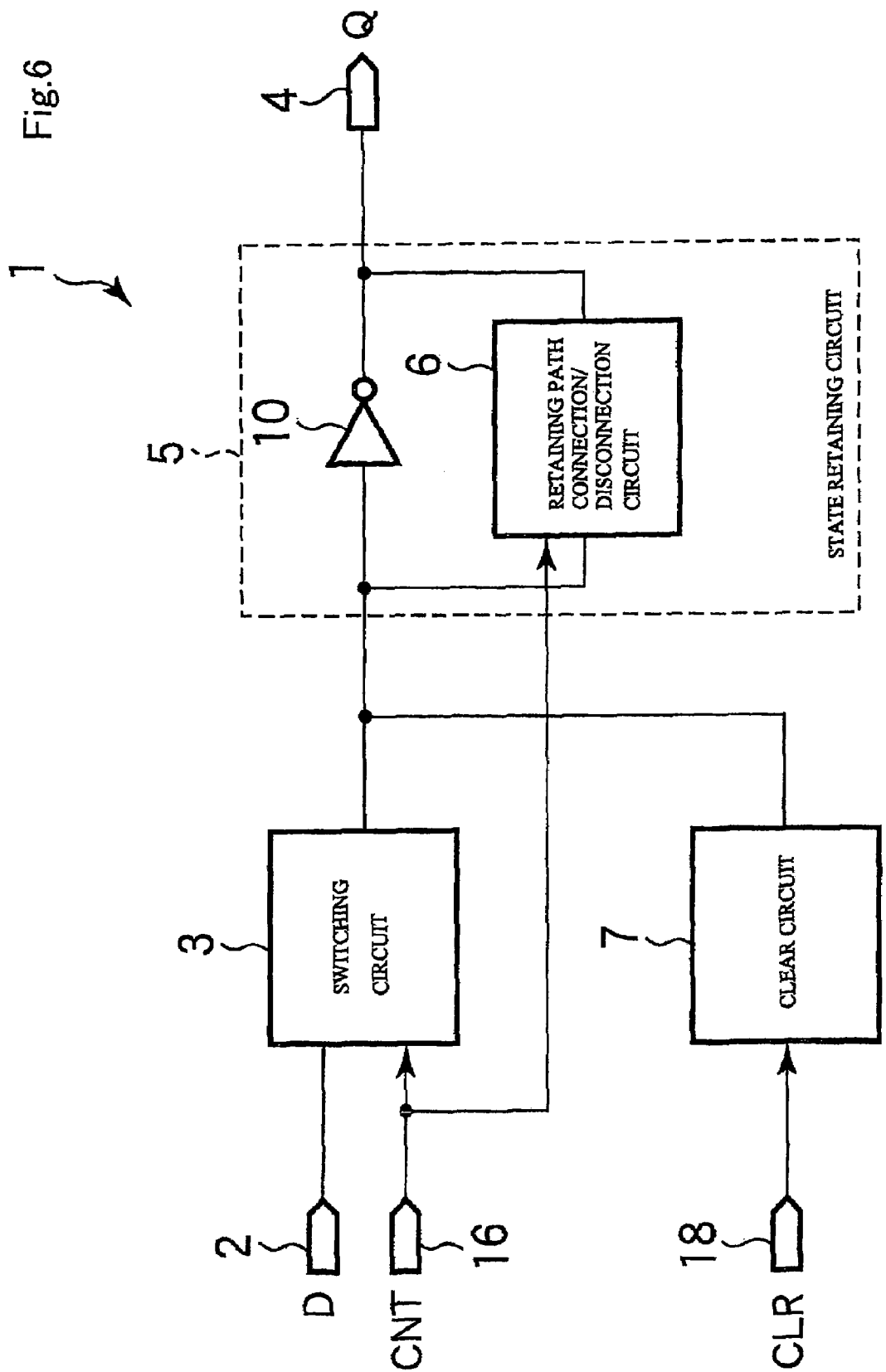
FIG. 6 is a diagram showing a basic schematic configuration of a latch circuit according to an embodiment.

A latch circuit, a flip-flop circuit including the latch circuit, and a logic circuit according to the present embodiment will now be described with reference to FIGS. 6 to 20. First, a latch circuit and a flip-flop circuit including the latch circuit according to the present embodiment will be described with reference to FIGS. 6 to 19. FIG. 6 is a diagram showing a basic schematic configuration of a latch circuit according to the present embodiment. As shown in FIG. 6, a latch circuit 1 includes: an input section 2 to which an external signal D is externally inputted; an input section 16 to which a predetermined control signal CNT is inputted; a switching circuit 3 that switches output/non-output of the external signal D inputted from the input section 2 based on the control signal CNT inputted to the input section 16; a state retaining circuit 5 that inputs a signal outputted from the switching circuit 3 as an input signal, and retains the state of the logical level of an output signal Q that is outputted based on the input signal; an output section 4 from which the output signal Q is outputted; an input section 18 to which a clear signal CLR is inputted; and a clear circuit 7 that changes the logical level of the input signal to a clear level based on the clear signal CLR inputted from the input section 18.

The state retaining circuit 5 inputs a signal outputted from the switching circuit 3 as an input signal, and includes: an inverter circuit 10 having, for example, a CMOS structure; and a retaining path connection/disconnection circuit 6 that feeds back the output signal Q to an input terminal of the inverter circuit 10 to which the input signal is inputted, and based on the control signal CNT, switches connection/disconnection of a state retaining path that retains the logical level of the output signal Q. The retaining path connection/disconnection circuit 6 operates so as to assume an output/non-output state in synchronization with a non-output/output state of the switching circuit 3.

In addition, only the inverter circuit 10 is disposed on the signal path of the state retaining circuit 5 over which the input signal is transmitted. Therefore, the load on the signal path of the latch circuit 1 decreases in comparison to a conventional clear function-added D latch circuit 301. As a result, the latch circuit 1 is capable of high-speed operations.

The clear circuit 7 includes a switch circuit (not shown) which, for instance, when switched to the side of a power supply terminal to which a power supply voltage is applied or to the side of a ground terminal that becomes a reference potential, connects the input terminal of the state retaining circuit 5 to the power source terminal or the ground terminal. Alternatively, the clear circuit 7 includes, for instance, a current supply that takes in current from the power supply terminal via the input terminal of the state retaining circuit 5 or supplies current to the ground terminal-side via the input terminal so that the input terminal assumes the power supply voltage level or the ground level. Consequently, as will be described later, the clear circuit 7 is capable of clearing the output signal Q by changing the logical level of the input signal inputted to the state retaining circuit 5 to a clear level (high level or low level).

Next, operations of the latch circuit 1 will be described. In the following description, it is assumed that: the switching circuit 3 changes to an output state in which signals are outputted when the control signal CNT is in a high-level state, and changes to a non-output state in which signals are not outputted when the control signal CNT is in a low-level state; and the retaining path connection/disconnection circuit 6 disconnects the state retaining path and changes to a non-output state in which signals are not outputted when the control signal CNT is in a high-level state, and connects the state retaining path and changes to an output state in which signals are outputted when the control signal CNT is in a low-level state.

First, a normal operation of the latch circuit 1 will be described. When an external signal D is inputted to the input section 2 when the control signal CNT is in a high-level state, the switching circuit 3 assumes an on-state in which the external signal D is transmitted from the input terminal to the output signal. Consequently, the switching circuit 3 outputs a signal based on the external signal D. The signal is inputted to the state retaining circuit 5 as an input signal. At this point, the retaining path connection/disconnection circuit 6 is in the non-output state. Therefore, the output terminal of the retaining path connection/disconnection circuit 6 is in a high-impedance state with respect to the input terminal of the state retaining circuit 5. In addition, during a normal operation, the connecting terminal of the clear circuit 7 connected to the connection point of the switching circuit 3 and the state retaining circuit 5 is, for instance, in a high-impedance state with respect to the input terminal of the state retaining circuit 5. Consequently, the retaining path connection/disconnection circuit 6 and the clear circuit 7 may be considered to be detached from the input terminal of the state retaining circuit 5. Therefore, during a normal operation, the retaining path connection/disconnection circuit 6 and the clear circuit 7 do not become loads on the signal line path.

The input signal inputted to the state retaining circuit 5 is subjected to 180 degrees-phase inversion at the inverter circuit 10, and is then outputted from the output terminal. Since the output terminal is connected to the output section 4, the inversion signal inverted at the inverter circuit 10 is outputted from the output section 4 as an output signal Q based on the input signal.

At this point, if the control signal CNT assumes a low-level state, the switching circuit 3 assumes an off-state in which the external signal D is not transmitted from the input terminal to the output terminal while the retaining path connection/disconnection circuit 6 assumes an on-state in which signals are transmitted from the input terminal to the output terminal. As a result, the switching circuit 3 assumes a non-output state while the retaining path connection/disconnection circuit 6 assumes an output-state. The retaining path connection/disconnection circuit 6 connects a state retaining path. Consequently, a latch loop is formed within the state retaining circuit 5 by the inverter circuit 10 and the retaining path connection/disconnection circuit 6. The retaining path connection/disconnection circuit 6 operates as, for instance, an inverter circuit. As a result, the retaining path connection/disconnection circuit 6 inverts the phase of the inversion signal outputted from the inverter circuit 10 by 180 degrees, and outputs a signal that is in-phase with the input signal. The signal is inputted to the inverter circuit 10. Meanwhile, since the output terminal of the switching circuit 3 assumes a high-impedance state with respect to the input terminal of the state retaining circuit 5, the output terminal of the switching circuit 3 may be considered to be detached from the input terminal. Therefore, the state retaining circuit 5 is capable of retaining the state of the logical level of the output signal Q and is able to continue output thereof.

Next, a clearing operation of the latch circuit 1 will be described. The clear circuit 7 is arranged to change the logical level of an input signal to a clear level during, for instance, the non-output state of the switching circuit 3. First, a case where an output signal Q is cleared to a high level will be described.

When a clear signal CLR for clearing the output signal Q to a high level is inputted to the input section 18, for instance, the clear circuit 7 switches a switch circuit, not shown, to the ground terminal-side. Consequently, the logical level of the input signal changes to a clear level that is a low level. When the logical level of the input signal changes to a low level, the potential of the input signal inputted to the state retaining circuit 5 drops below the threshold voltage of a PMOSFET (p-type transistor) of the inverter circuit 10. As a result, the inverter circuit 10 outputs an inversion signal whose logical level is at a high level. In this manner, the output signal Q is cleared to a high level.

In addition, the clear circuit 7 may be arranged so that, for instance, a current source is used in place of a switch circuit to take in current from the input terminal of the state retaining circuit 5. During a clearing operation, since the clear circuit 7 and the retaining path connection/disconnection circuit 6 are connected to the input terminal of the inverter circuit 10, the clear circuit 7 is capable of taking in current from the power supply terminal via the retaining path connection/disconnection circuit 6 and the input terminal. Assuming that the resistance value of the internal resistance of the retaining path connection/disconnection circuit 6 is substantially constant, the potential at the input terminal becomes lower as the current value of the current taken in by the clear circuit 7 becomes larger. Therefore, by having the clear circuit 7 take in current from the input terminal so that the potential of the input terminal drops below the threshold voltage of the PMOSFET of the inverter circuit 10, the latch circuit 1 operates in the same manner as described above and is able to clear the output signal Q to a high level.

Next, a case where the output signal Q is cleared to a low level will be described. When a clear signal CLR for clearing the output signal Q to a low level is inputted to the input section 18, for instance, the clear circuit 7 switches a switch circuit, not shown, to the power supply terminal-side. Consequently, the logical level of the input signal changes to a clear level that is a high level. When the logical level of the input signal changes to a high level, the potential of the input signal inputted to the state retaining circuit 5 rises above the threshold voltage of an NMOSFET (n-type transistor) of the inverter circuit 10. As a result, the inverter circuit 10 outputs an inversion signal whose logical level is at a low level. In this manner, the output signal Q is cleared to a low level.

In addition, the clear circuit 7 may be arranged so that, for instance, a current source is used in place of a switch circuit to supply current to the input terminal of the state retaining circuit 5. During a clearing operation, since the clear circuit 7 and the retaining path connection/disconnection circuit 6 are connected to the input terminal of the inverter circuit 10, the clear circuit 7 is capable of supplying current to the ground terminal via the retaining path connection/disconnection circuit 6 and the input terminal. Assuming that the resistance value of the internal resistance of the retaining path connection/disconnection circuit 6 is substantially constant, the potential at the input terminal becomes higher as the current value of the current supplied by the clear circuit 7 becomes larger. Therefore, by having the clear circuit 7 supply a current to the retaining path connection/disconnection circuit 6 via the input terminal so that the potential of the input signal rises above the threshold voltage of the NMOSFET of the inverter circuit 10, the latch circuit 1 operates in the same manner as described above and is able to clear the output signal Q to a low level.

As described above, according to the present embodiment, the latch circuit 1 includes a clear circuit 7 that changes the logical level of an input signal inputted to the state retaining circuit 5 to a clear level. Consequently, the latch circuit 1 no longer requires a NOR circuit or the like for clearing the output signal Q to be disposed on the signal path as is the case with the conventional clear function-added D latch circuit 301, and only the inverter circuit 10 need be disposed. As a result, the load on the signal path of the latch circuit 1 decreases in comparison to the conventional clear function-added D latch circuit 301. Consequently, the latch circuit 1 is able to include a clear function (set/reset function) without increasing the load on a high-speed signal path that requires high-speed transfer, and is capable of improving circuit performance. Accordingly, the latch circuit 1 is applicable to a latch circuit included in a multiplexer (MUX) circuit that is a component of a high-speed interface IC that operates at or above the gigahertz band, a divider circuit, or the like.

Furthermore, by using the latch circuit 1 according to the present embodiment as at least one of the master circuit and the slave circuit of the DFF circuit 101 shown in FIG. 21, a clear function-added DFF circuit capable of high-speed transfer may be realized.

Henceforth, a specific description of a latch circuit and a flip-flop circuit including the latch circuit according to the present embodiment will be given using examples. In the following examples, a D latch circuit will be described as the latch circuit.

Example 1 of the Embodiment

Figure 7:
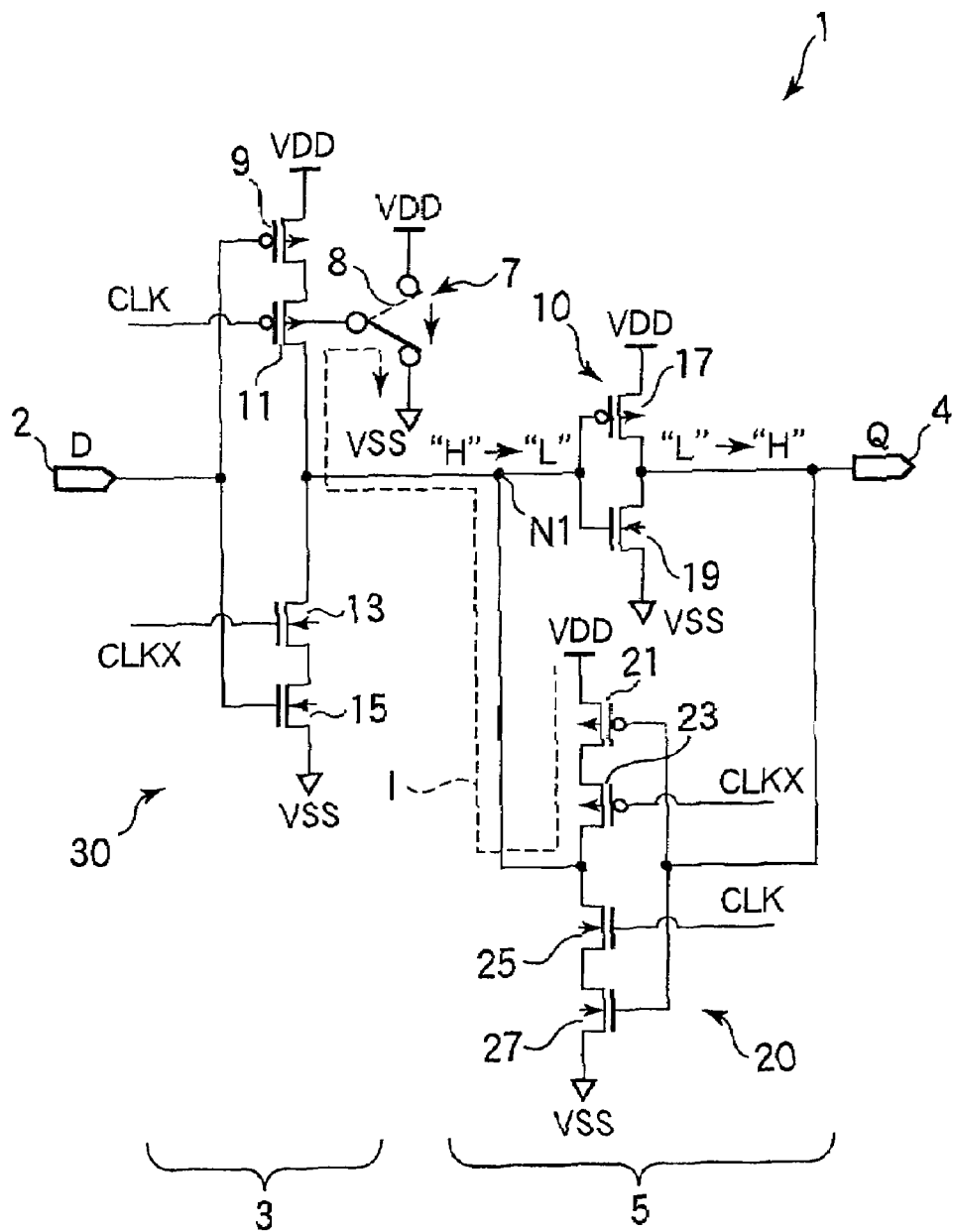
FIG. 7 is a diagram showing an exemplary circuit configuration of a latch circuit 1 according to example 1.

First, a latch circuit 1 according to example 1 of the embodiment will be described with reference to FIGS. 7 and 8. FIG. 7 shows an example of a circuit configuration of the latch circuit 1 according to the present example. As shown in FIG. 7, the latch circuit 1 includes: a switching circuit 3 that switches output/non-output of an externally inputted external signal D based on clock signals (predetermined control signals) CLK and CLKX; a state retaining circuit 5 that inputs a signal outputted from the switching circuit 3 as an input signal, and retains the state of the logical level of an output signal Q that is outputted based on the input signal; and a clear circuit 7 that changes the logical level of the input signal to a clear level based on a clear signal, not shown.

The switching circuit 3 includes a gated inverter circuit (first gated inverter circuit) 30 capable of connecting and disconnecting an output terminal to a power supply terminal to which a power supply voltage VDD is applied or to a ground terminal that becomes a reference potential VSS based on the clock signals CLK and CLKX. The state retaining circuit 5 includes: an inverter circuit 10 to which a signal outputted from the gated inverter circuit 30 is inputted as an input signal; and a gated inverter circuit 20 to which a signal outputted from the inverter circuit 10 is inputted and which outputs an output signal to an input terminal of the inverter circuit 10.

The gated inverter circuit 30 includes PMOSFETs 9, 11 and NMOSFETs 13, 15 connected in series between the power supply terminal and the ground terminal. A source terminal of the PMOSFET 9 is connected to the power supply terminal, while a drain terminal thereof is connected to a source terminal of the PMOSFET 11. A drain terminal of the PMOSFET 11 is connected to a drain terminal of the NMOSFET 13. A source terminal of the NMOSFET 13 is connected to a drain terminal of the NMOSFET 15. A source terminal of the NMOSFET 15 is connected to the ground terminal. Drain terminals of the PMOSFET 11 and the NMOSFET 13 become output terminals of the gated inverter circuit 30.

An input section 2 to which an external signal D is inputted is connected to gate terminals of the PMOSFET 9 and the NMOSFET 15 respectively. The gate terminals of the PMOSFET 9 and the NMOSFET 15 become input terminals of the gated inverter circuit 30. The clock signal CLK is inputted to a gate terminal of the PMOSFET 11 while the clock signal CLKX is inputted to a gate terminal of the NMOSFET 13.

The PMOSFET 11 operates so as to respectively connect the drain terminals of both FETs 11 and 13 which are output terminals to the power supply terminal when the clock signal CLK is at a low level, and to respectively disconnect the drain terminals of both FETs 11 and 13 from the power supply terminal when the clock signal CLK is at a high level. Meanwhile, the NMOSFET 13 operates so as to respectively disconnect the drain terminals of both FETs 11 and 13 from the ground terminal when the clock signal CLKX is at a low level, and to respectively connect the drain terminals of both FETs 11 and 13 to the ground terminal when the clock signal CLKX is at a high level.

Since the clock signal CLK and the clock signal CLKX are 180 degrees out-of-phase from each other, the clock signal CLKX assumes a high level when the clock signal CLK is at a low level and assumes a low level when the clock signal CLK is at a high level. When the clock signal CLK is at a low level and the clock signal CLKX is at a high level, the PMOSFET 11 and the NMOSFET 13 connect the drain terminals of both FETs 11 and 13 to the power supply terminal and the ground terminal respectively, and the gated inverter circuit 30 operates as an inverter circuit.

The clear circuit 7 is connected to a back gate terminal of the PMOSFET 11. Therefore, the switching circuit 3 is a transistor that controls connection/disconnection to the power supply terminal based on the clock signal CLK, and includes the PMOSFET (first transistor) 11 having a gate terminal to which the clock signal CLK is inputted and a back gate terminal to which the clear circuit 7 is connected.

The inverter circuit 10 included in the state retaining circuit 5 includes a PMOSFET 17 and an NMOSFET 19 connected in series between the power supply terminal and the ground terminal. A source terminal of the PMOSFET 17 is connected to the power supply terminal, while a drain terminal thereof is connected to a drain terminal of the NMOSFET 19. A source terminal of the NMOSFET 19 is connected to the ground terminal. Gate terminals of the PMOSFET 17 and the NMOSFET 19 are mutually connected, and are connected to the drain terminals of the PMOSFET 11 and the NMOSFET 13. The gate terminals of the PMOSFET 17 and the NMOSFET 19 become input terminals of the gated inverter circuit 10 as well as input terminals of the state retaining circuit 5. The drain terminals of the PMOSFET 17 and the NMOSFET 19 are connected to an output section 4, and are also connected to gate terminals of a PMOSFET 21 and an NMOSFET 27 of the gated inverter circuit 20. The drain terminals of the PMOSFET 17 and the NMOSFET 19 become output terminals of the inverter circuit 10 as well as output terminals of the state retaining circuit 5.

The gated inverter circuit 20 includes PMOSFETs 21, 23 and NMOSFETs 25, 27 connected in series between the power supply terminal and the ground terminal. A source terminal of the PMOSFET 21 is connected to the power supply terminal, while a drain terminal thereof is connected to a source terminal of the PMOSFET 23. A drain terminal of the PMOSFET 23 is connected to a drain terminal of the NMOSFET 25. A source terminal of the NMOSFET 25 is connected to a drain terminal of the NMOSFET 27. A source terminal of the NMOSFET 27 is connected to the ground terminal.

The drain terminals of the PMOSFET 23 and the NMOSFET 25 are connected to the gate terminals of both FETs 17 and 19 of the inverter circuit 10 as well as the drain terminals of both FETs 11 and 13 of the gated inverter circuit 30. The drain terminals of the PMOSFET 23 and the NMOSFET 25 become output terminals of the gated inverter circuit 20. The connection point of the respective output terminals of the gated inverter circuits 20 and 30 and the input terminal of the inverter circuit 10 becomes a node N1.

The gate terminals of the PMOSFET 21 and the NMOSFET 27 that are connected to the output terminal of the inverter circuit 10 become input terminals of the gated inverter circuit 20. The clock signal CLKX is inputted to the gate terminal of the PMOSFET 23 while the clock signal CLK is inputted to the gate terminal of the NMOSFET 25.

The PMOSFET 23 operates so as to connect the output terminal of the gated inverter circuit 20 to the power supply terminal when the clock signal CLKX is at a low level, and to disconnect the output terminal from the power supply terminal when the clock signal CLKX is at a high level. Meanwhile, the NMOSFET 25 operates so as to disconnect the output terminal of the gated inverter circuit 20 from the ground terminal when the clock signal CLK is at a low level, and to disconnect the output terminal to the ground terminal when the clock signal CLK is at a high level.

Since the clock signal CLK and the clock signal CLKX are 180 degrees out-of-phase from each other, when the clock signal CLKX assumes a low level and the clock signal CLK assumes a high level, the PMOSFET 23 and the NMOSFET 25 respectively connect the output terminals of the gated inverter circuit 20 to the power supply terminal and the ground terminal, whereby the gated inverter circuit 20 operates as an inverter circuit. Meanwhile, when the clock signal CLKX assumes a high level and the clock signal CLK assumes a low level, the PMOSFET 23 and the NMOSFET 25 respectively disconnect the output terminals from the power supply terminal and the ground terminal, whereby the output terminal assumes a high-impedance state regardless of the state of the input terminals. In this manner, the gated inverter circuit 20 is capable of switching connection/disconnection of the state retaining path that feeds back an output signal from the inverter circuit 10 to the input terminal to which is inputted a signal outputted from the switching circuit 3 as an input signal and which retains the logical level of the output signal.

The clear circuit 7 includes a switch circuit (first switch circuit) 8 connected to the back gate terminal of the PMOSFET 11. Based on a clear signal, not shown, the switch circuit 8 is switched so as to connect the back gate terminal of the PMOSFET 11 to the power supply terminal during a normal operation of the latch circuit 1 and to connect the back gate terminal of the PMOSFET 11 to the ground terminal during a clearing operation.

Figure 8:
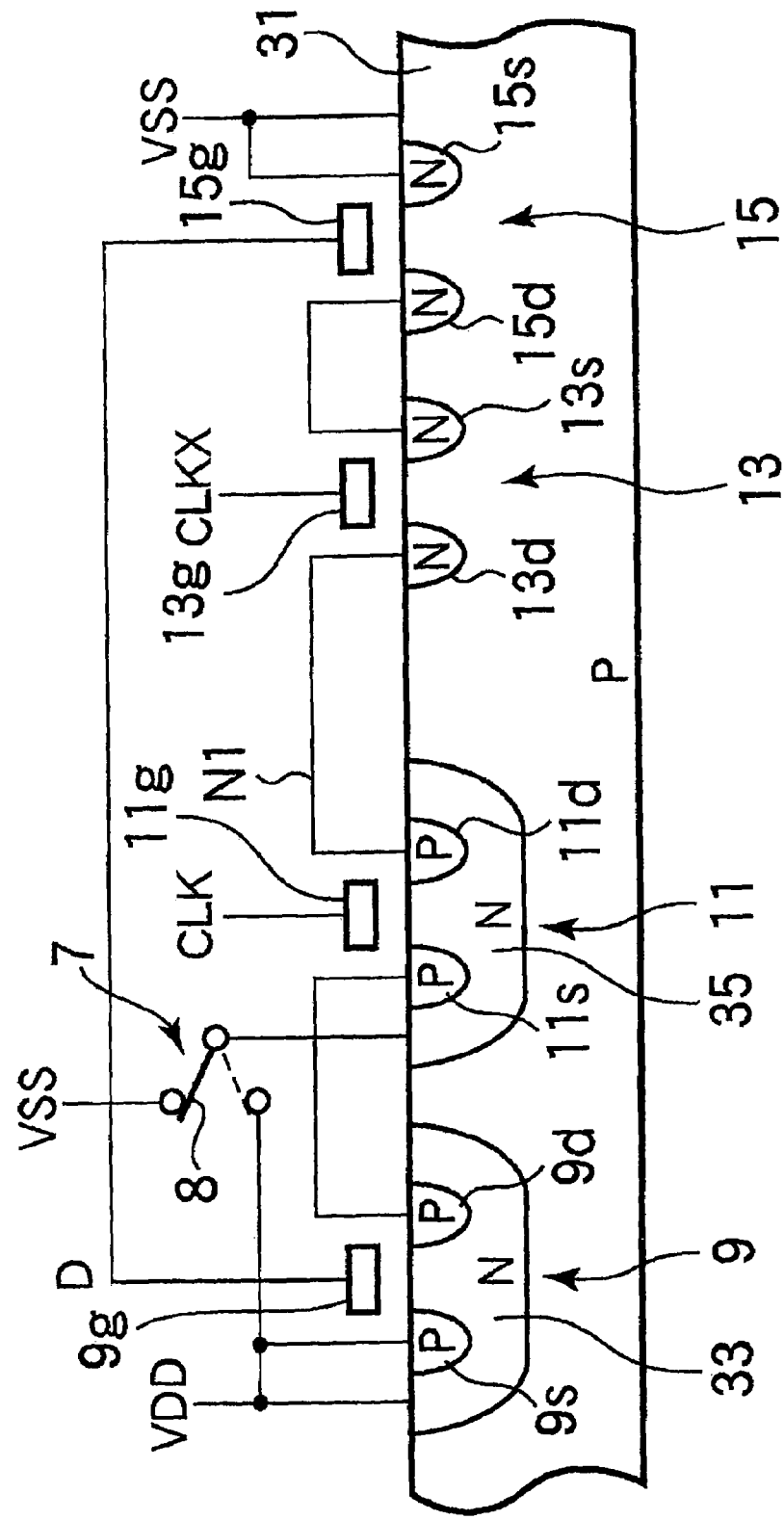
FIG. 8 is a cross sectional view schematically showing a configuration of a gated inverter circuit 30.

FIG. 8 is a cross sectional view schematically showing a configuration of the gated inverter circuit 30. As shown in FIG. 8, the gated inverter circuit 30 includes a p-type silicon substrate 31 connected to the ground terminal and to which a back bias is applied. PMOSFETs 9, 11 and NMOSFETs 13, 15 are aligned and formed on the silicon substrate 31. The PMOSFET 9 includes: an n-well back gate region 33 formed in a p-type impurity region of the silicon substrate 31; a gate electrode 9g disposed on the back gate region 33 via an insulation film (not shown); and a source region 9s and a drain region 9d that are p-type impurity diffused layers respectively formed on both sides of a channel region formed on the n-well at a lower layer of the gate electrode 9g. The back gate region 33 is connected to the power supply terminal via a back gate terminal, not shown, and a back gate bias is applied thereto. The source region 9s is connected to the power supply terminal via a source terminal, not shown.

The PMOSFET 11 includes: an n-well back gate region 35 formed in a p-type impurity region of the silicon substrate 31; a gate electrode 11g disposed on the back gate region 35 via an insulation film (not shown); and a source region 11s and a drain region 11d that are p-type impurity diffused layers respectively formed on both sides of a channel region formed on the n-well at a lower layer of the gate electrode 11g. The switch circuit 8 included in the clear circuit 7 is connected via a back gate terminal, not shown, to the back gate region 35. The source region 11s is connected to the drain region 9d of the PMOSFET 9 via a source terminal, not shown. The clock signal CLK is inputted via a gate terminal, not shown, to the gate electrode 11g.

The NMOSFET 13 includes: a gate electrode 13g disposed on the p-type impurity region of the silicon substrate 31 via an insulation film (not shown); and a drain region 13d and a source region 13s that are n-type impurity diffused layers respectively formed on both sides of a channel region formed in the p-type impurity region at a lower layer of the gate electrode 13g. The drain region 13d is connected to the drain region 11d of the PMOSFET 11 via a drain terminal, not shown. The connection point of the drain regions 11d and 13d become a node N1. The clock signal CLKX is inputted via a gate terminal, not shown, to the gate electrode 13g.

The NMOSFET 15 includes: a gate electrode 15g disposed on the p-type impurity region of the silicon substrate 31 via an insulation film (not shown); and a drain region 15d and a source region 15s that are n-type impurity diffused layers respectively formed on both sides of a channel region formed in the p-type impurity region at a lower layer of the gate electrode 15g. The drain region 15d is connected to the source region 13s of the NMOSFET 13 via a drain terminal, not shown. The source region 15s is connected to the ground terminal via a source terminal, not shown. The gate electrode 15g is connected to the gate electrode 9g of the PMOSFET 9 via a gate terminal, not shown. An external signal D is inputted to the gate electrodes 9g and 15g.

Next, operations of the latch circuit 1 will be described with reference to FIGS. 7 and 8. The gated inverter circuit 30 operates as an inverter circuit when the clock signal CLK is in a low level state and the clock signal CLKX is in a high level state. At this point, when the external signal D is inputted to the input section 2, the gated inverter circuit 30 outputs an inversion signal whose phase is inverted by 180 degrees with respect to the external signal D. The inversion signal is inputted to the state retaining circuit 5 as an input signal. At this point, the PMOSFET 23 and the NMOSFET 25 of the gated inverter circuit 20 assume off-states, and the drain terminals of both FETs 23 and 25 are respectively disconnected from the power supply terminal and the ground terminal. As a result, the gated inverter circuit 20 is in a non-output state. The output terminal of the gated inverter circuit 20 assumes a high-impedance state with respect to the input terminal of the state retaining circuit 5. Therefore, the gated inverter circuit 20 may be considered to be detached from the input terminal of the state retaining circuit 5. In addition, during a normal operation of the latch circuit 1, the switch circuit 8 within the clear circuit 7 is switched to the power supply terminal-side and a power supply voltage VDD is applied to the back gate terminal of the PMOSFET 11.

The input signal inputted to the state retaining circuit 5 (the inversion signal outputted from the gated inverter circuit 30) is subjected to 180 degrees-phase inversion at the inverter circuit 10, and is then outputted from the output terminal. Since the output terminal is connected to the output section 4, the signal outputted from the inverter circuit 10 is outputted from the output section 4 as an output signal Q based on the input signal.

At this point, if the clock signal CLK assumes a high level state and the clock signal CLKX assumes a low level state, the PMOSFET 11 and the NMOSFET 13 assume off-states, and the drain terminals of both FETs 11 and 13 are respectively disconnected from the power supply terminal and the ground terminal. As a result, the gated inverter circuit 30 assumes a non-output state. Meanwhile, the PMOSFET 23 and the NMOSFET 25 assume on-states, and the drain terminals of both FETs 23 and 25 are respectively connected to the power supply terminal and the ground terminal. As a result, the gated inverter circuit 20 assumes an output state. Since the gated inverter circuit 20 connects a state retaining path, a latch loop is formed within the state retaining circuit 5 by the inverter circuit 10 and the gated inverter circuit 20.

The gated inverter circuit 20 operates as an inverter circuit. Therefore, a signal outputted by the inverter circuit 10 and inputted to the gated inverter circuit 20 is outputted with its phase inverted by 180 degrees. The signal outputted by the gated inverter circuit 20 is in-phase with the input signal, and is inputted to the inverter circuit 10. Meanwhile, since the output terminal of the gated inverter circuit 30 assumes a high-impedance state with respect to the input terminal of the state retaining circuit 5, the output terminal of the gated inverter circuit 30 may be considered to be detached from the input terminal. Therefore, the state retaining circuit 5 is capable of retaining the state of the logical level of the output signal Q based on the input signal already inputted without being depended on by the logical level of the external signal D inputted to the input section 2.

Next, a clearing operation of the latch circuit 1 will be described. The clear circuit 7 is arranged to change the logical level of the input signal at the node N1 to a clear level during the non-output state of the switching circuit 3. Therefore, during a clearing operation, the clock signal CLK assumes a high level while the clock signal CLKX assumes a low level. As shown in FIG. 7, in the present example, the latch circuit 1 is capable of changing the logical level of the input signal at the node N1 to a low level to clear the output signal Q to a high level.

As shown in FIG. 7, in the event that a clear signal CLR, not shown, is inputted to the clear circuit 7 when the logical level at the node N1 is at a high (H) level and the logical level of the output signal Q is at a low (L) level, the switch circuit 8 is switched from the power supply terminal-side to the ground terminal-side. Consequently, the back gate terminal of the PMOSFET 11 is connected to the ground terminal.

As shown in FIG. 8, when the back gate terminal of the PMOSFET 11 is connected to the ground terminal, the back gate region 35 is also connected to the ground terminal and changes to a low level. Meanwhile, the node N1 is at a high level. Therefore, through a p-n junction formed by the drain region 11d and the back gate region 35 of the PMOSFET 11, as shown in FIG. 7, a current path is formed by the power supply terminal, the PMOSFETs 21, 23 of the gated inverter circuit 20, the node N1, the PMOSFET 11 of the gated inverter circuit 30, the switch circuit 8 and the ground terminal, whereby a current I flows through the current path. The potential of the node N1 drops and becomes substantially equal to the reference potential VSS. Since the logical level of the input signal at the node N1 changes to the low (L) level, the inverter circuit 10 outputs a high-level signal.

Because the clock signal CLK is at a high level and the clock signal CLKX is at a low level, a latch loop is formed within the state retaining circuit 5. The output signal from the inverter circuit 10 is retained in the state retaining circuit 5 by the latch loop, and the logical level of the output signal Q is cleared to a high level. Subsequently, the switch circuit 8 is switched to the power supply terminal-side. Even when the switch circuit 8 is switched to the power supply terminal-side, since the gated inverter circuit 30 is in a non-output state, the state retaining circuit 5 retains an output signal Q whose logical level is a high level and continues output thereof without being depended on by the external signal D.

In the present example, while a reference potential VSS is applied to one terminal of the switch circuit 8, a voltage that is lower than the threshold voltage of the PMOSFET (p-type transistor) 17 of the inverter circuit 10 may be applied instead. During a reset operation, the clear circuit 7 is able to change the logical level of the input signal to a low level by bringing the potential of the input signal below the threshold voltage of the PMOSFET 17 via the back gate terminal of the PMOSFET 11. Consequently, since the inverter circuit 10 outputs a high-level signal, the output signal Q may be cleared to a high level.

As described above, according to the present example, the latch circuit 1 is capable of changing the logical level of an input signal at the node N1 to a clear level that is a low level via the switching circuit 3. In other words, since the latch circuit 1 is capable of changing the input signal at the node N1 to a low level via the back gate terminal of the PMOSFET 11, there is no more need to dispose a NOR circuit or the like for clearing the output signal Q on the signal path as is the case with the conventional clear function-added D latch circuit 301. Consequently, the latch circuit 1 according to the present example achieves similar advantages to the latch circuit 1 shown in FIG. 6.

Example 2 of the Embodiment

Figure 9:
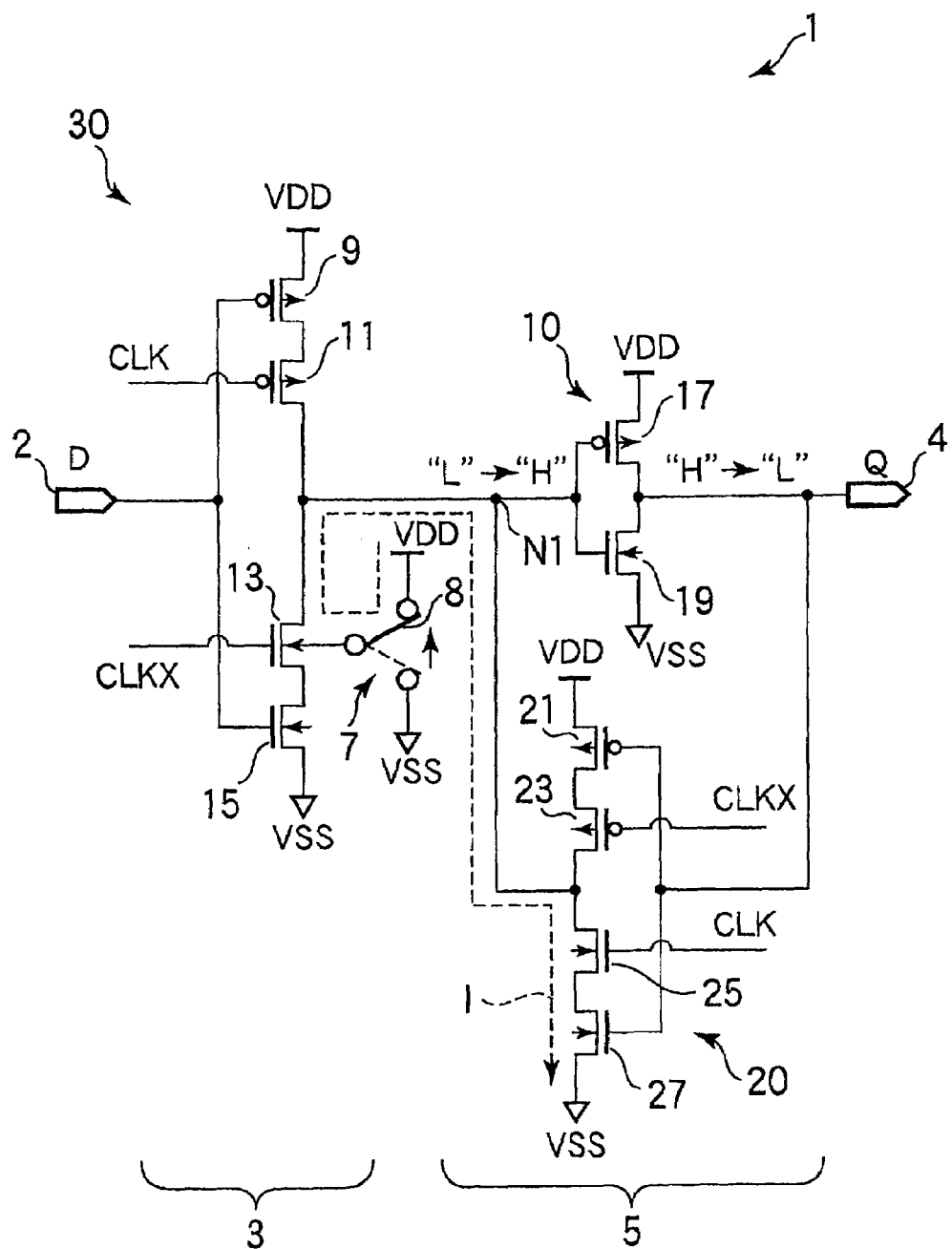
FIG. 9 is a diagram showing an exemplary circuit configuration of a latch circuit 1 according to example 2.

Next, a latch circuit 1 according to example 2 of the present embodiment will be described with reference to FIGS. 9 and 10. FIG. 9 shows an example of a circuit configuration of the latch circuit 1 according to the present example. In the latch circuit 1 according to example 1 described above, the clear circuit 7 is connected to the back gate terminal of the PMOSFET 11. In comparison thereto, as shown in FIG. 9, in the latch circuit 1 according to the present example, the clear circuit 7 is connected to the back gate terminal of an NMOSFET 13. With the exception of the position to which the clear circuit 7 is connected, the configuration of the latch circuit 1 according to the present example is the same as that of the latch circuit 1 according to example 1. In consideration thereof, portions in which the configuration of the latch circuit 1 according to the present example is the same as that of the latch circuit 1 according to example 1 shall be omitted from the following description.

Figure 10:
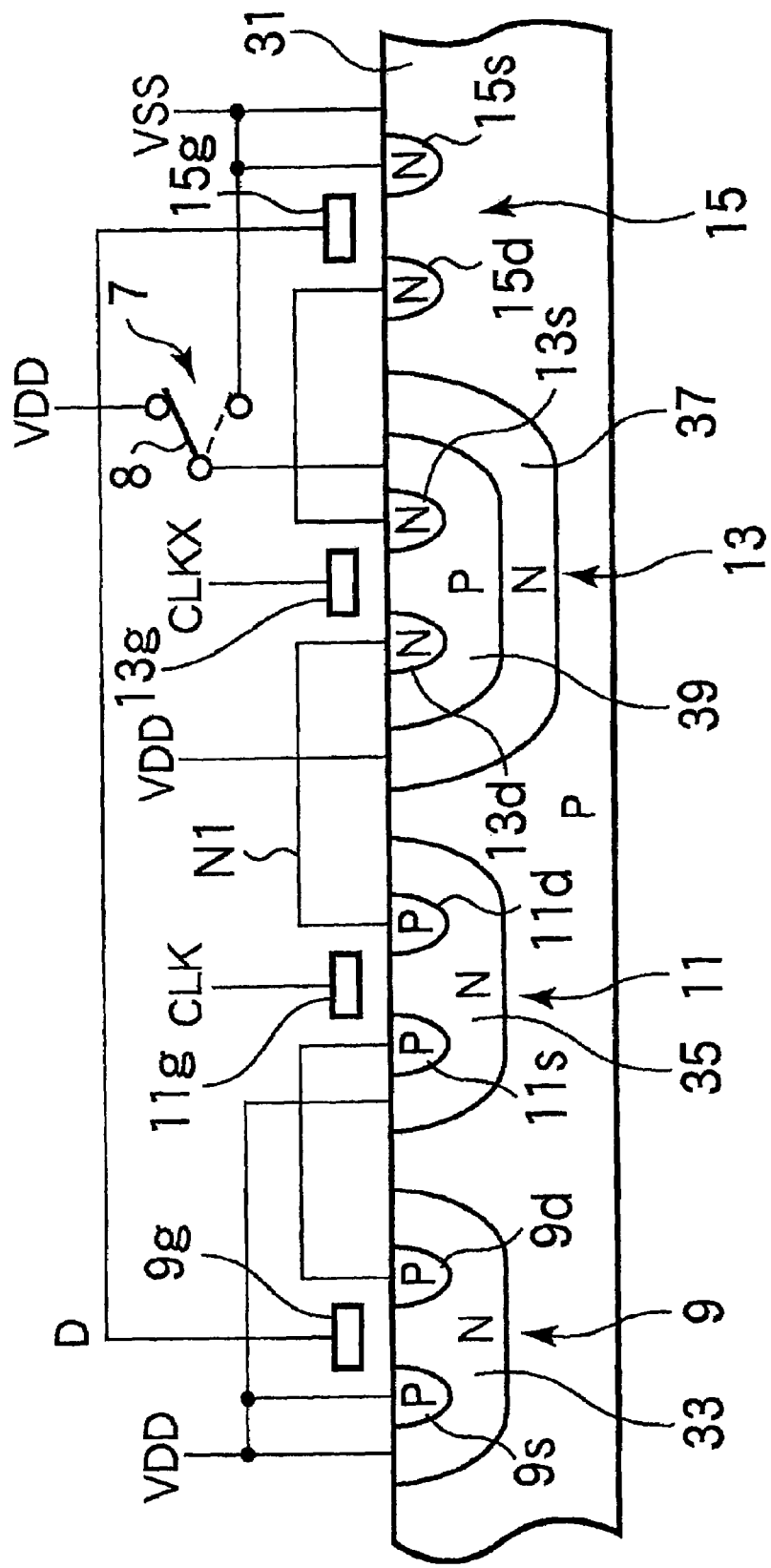
FIG. 10 is a cross sectional view schematically showing a configuration of a gated inverter circuit 30.

FIG. 10 is a cross sectional view schematically showing a configuration of a gated inverter circuit 30. As shown in FIG. 10, the gated inverter circuit 30 included in the latch circuit 1 according to the present example differs from the gated inverter circuit 30 included in the latch circuit 1 according to example 1 in that the back gate region 35 of the PMOSFET 11 is constantly connected to the power supply terminal and the NMOSFET 13 has a different configuration. The NMOSFET 13 includes: an n-well 37 formed in a p-type impurity region of the silicon substrate 31; a gate electrode 13g disposed on a p-well back gate region 39 disposed on a forming region of the n-well 37 via an insulation film (not shown); and a source region 13s and a drain region 13d of an n-type impurity diffused layer respectively formed on both sides of a channel region formed on the back gate region 39 at a lower layer of the gate electrode 13g. The n-well 37 is connected to the power supply terminal and a back gate bias is applied thereto. The back gate region 39 is connected via a back gate terminal, not shown, to a switch circuit (first switch circuit) 8 included in the clear circuit 7.

The clear circuit 7 is connected to a back gate terminal of the NMOSFET 13. Therefore, the switching circuit 3 is a transistor that controls connection/disconnection to the power supply terminal based on the clock signal CLKX, and includes an NMOSFET (first transistor) 13 having a gate terminal to which the clock signal CLKX is inputted and a back gate terminal to which the clear circuit 7 is connected.

Next, operations of the latch circuit 1 according to the present example will be described with reference to FIGS. 9 and 10. With the latch circuit 1 according to the present example, the back gate terminal of the NMOSFET 13 is connected to the ground terminal via the switch circuit 8. Thus, since the normal operation of the latch circuit 1 according to the present example is the same as that of example 1 described above, a description thereof will be omitted.

Next, a clearing operation of the latch circuit 1 according to the present example will be described. As shown in FIG. 9, in the present example, the latch circuit 1 is capable of changing the logical level of an input signal at the node N1 to a clear level that is a high level to clear the output signal Q to a low level.

As shown in FIG. 9, in the event that a clear signal CLR, not shown, is inputted to the clear circuit 7 when the logical level at the node N1 is at a low (L) level and the logical level of the output signal Q is at a high (H) level, the switch circuit 8 is switched from the ground terminal-side to the power supply terminal-side. Consequently, the back gate terminal of the NMOSFET 13 is connected to the power supply terminal.

As shown in FIG. 10, when the back gate terminal of the NMOSFET 13 is connected to the power supply terminal, the back gate region 39 is also connected to the power supply terminal and changes to a high level. Meanwhile, the node N1 is at a low level. Therefore, through a p-n junction formed by the back gate region 39 and the drain region 13d of the NMOSFET 13, as shown in FIG. 9, a current path is formed by the power supply terminal, the switch circuit 8, the NMOSFET 13, the node N1, the NMOSFETs 25, 27 of the gated inverter circuit 20, and the ground terminal, whereby a current I flows through the current path. The potential of the node N1 rises and becomes substantially equal to the power supply voltage VDD. Since the logical level of the input signal at the node N1 changes to a high (H) level, the inverter circuit 10 outputs a low-level signal.

At this point, a latch loop is formed within the state retaining circuit 5. The output signal from the inverter circuit 10 is retained in the state retaining circuit 5 by the latch loop, and the logical level of the output signal Q is cleared to a low level. Subsequently, the switch circuit 8 is switched to the ground terminal-side. Even when the switch circuit 8 is switched to the ground terminal-side, since the gated inverter circuit 30 is in a non-output state, the state retaining circuit 5 retains an output signal Q whose logical level is a low level and continues output thereof without being depended on by the external signal D.

In the present example, while a power supply voltage VDD is applied to one terminal of the switch circuit 8 during a clearing operation, a voltage that is higher than the threshold voltage of the NMOSFET (n-type transistor) 19 of the inverter circuit 10 may be applied instead. In this case, during a reset operation, the potential of the input signal at the node N1 rises above the threshold voltage of the NMOSFET 19 of the inverter circuit 10 via the back gate terminal of the NMOSFET 13. Consequently, since the inverter circuit 10 inverts a high-level input signal to output a low-level signal, the output signal Q may be cleared to a low level.

As described above, according to the present example, the latch circuit 1 is capable of changing the logical level of an input signal at the node N1 to a clear level that is a high level via the switching circuit 3. In other words, because the latch circuit 1 is capable of changing the input signal at the node N1 to a high level via the back gate terminal of the NMOSFET 13, similar advantages to the latch circuit 1 according to example 1 may be achieved.

Example 3 of the Embodiment

Figure 11:
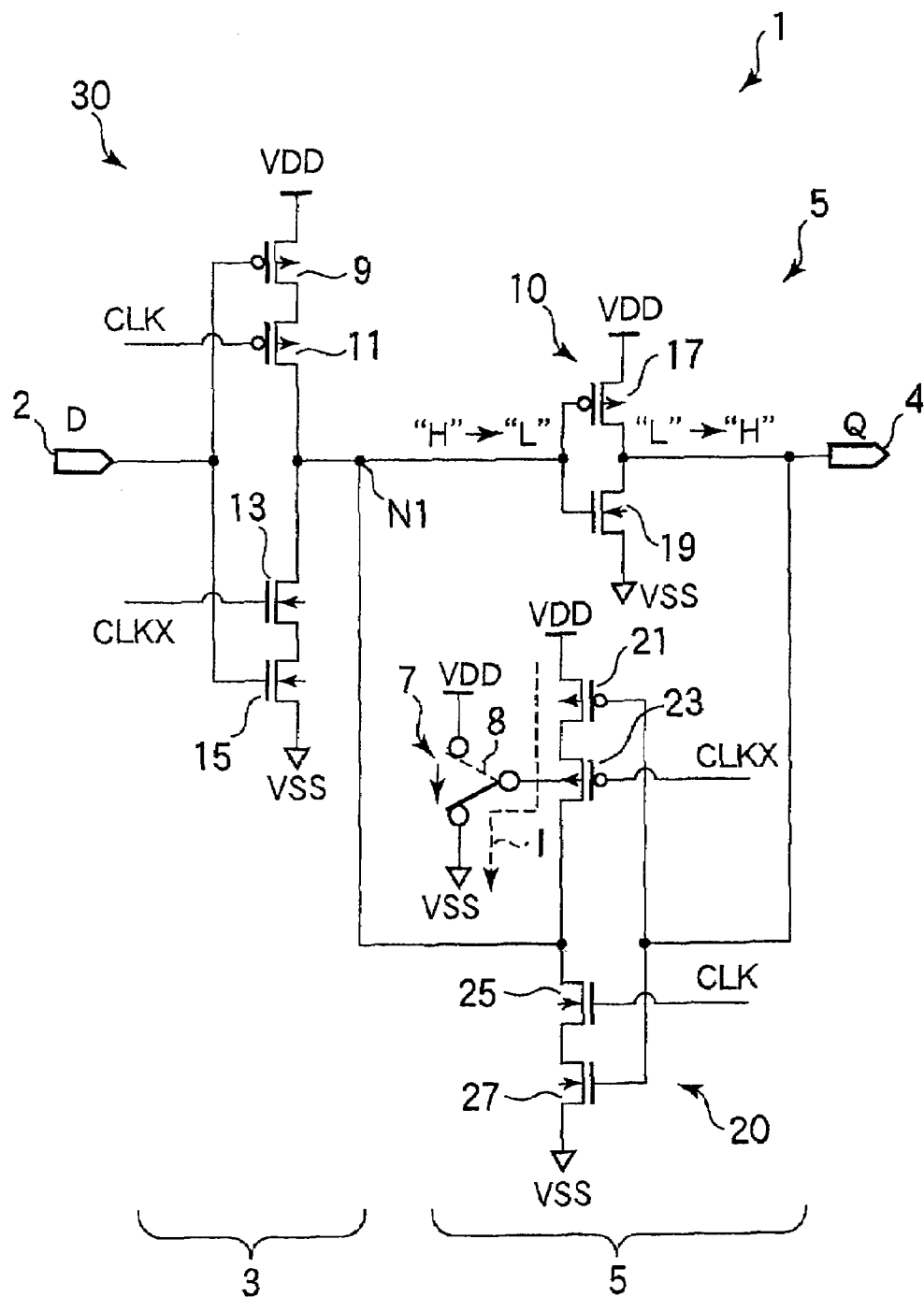
FIG. 11 is a diagram showing an exemplary circuit configuration of a latch circuit 1 according to example 3.

Next, a latch circuit 1 according to example 3 of the embodiment will be described with reference to FIGS. 11 and 12. FIG. 11 shows an example of a circuit configuration of the latch circuit 1 according to the present example. In the latch circuit 1 according to examples 1 and 2 described above, the clear circuit 7 is connected to the switching circuit 3. In comparison thereto, as shown in FIG. 11, in the latch circuit 1 according to the present example, the clear circuit 7 is connected to the state retaining circuit 5. With the exception of the position to which the clear circuit 7 is connected, the configuration of the latch circuit 1 according to the present example is the same as that of the latch circuit 1 according to example 1. In consideration thereof, portions in which the configuration of the latch circuit 1 according to the present example is the same as that of the latch circuit 1 according to example 1 shall be omitted from the following description.

The clear circuit 7 is connected to a back gate terminal of a PMOSFET 23. Therefore, a retaining path connection/disconnection circuit is a transistor that controls connection/disconnection to the power supply terminal based on the clock signal CLKX, and includes a gated inverter circuit (second gated inverter circuit) 20 that uses a PMOSFET (second transistor) 23 having a gate terminal to which the clock signal CLKX is inputted and a back gate terminal to which the clear circuit 7 is connected.

Figure 12:
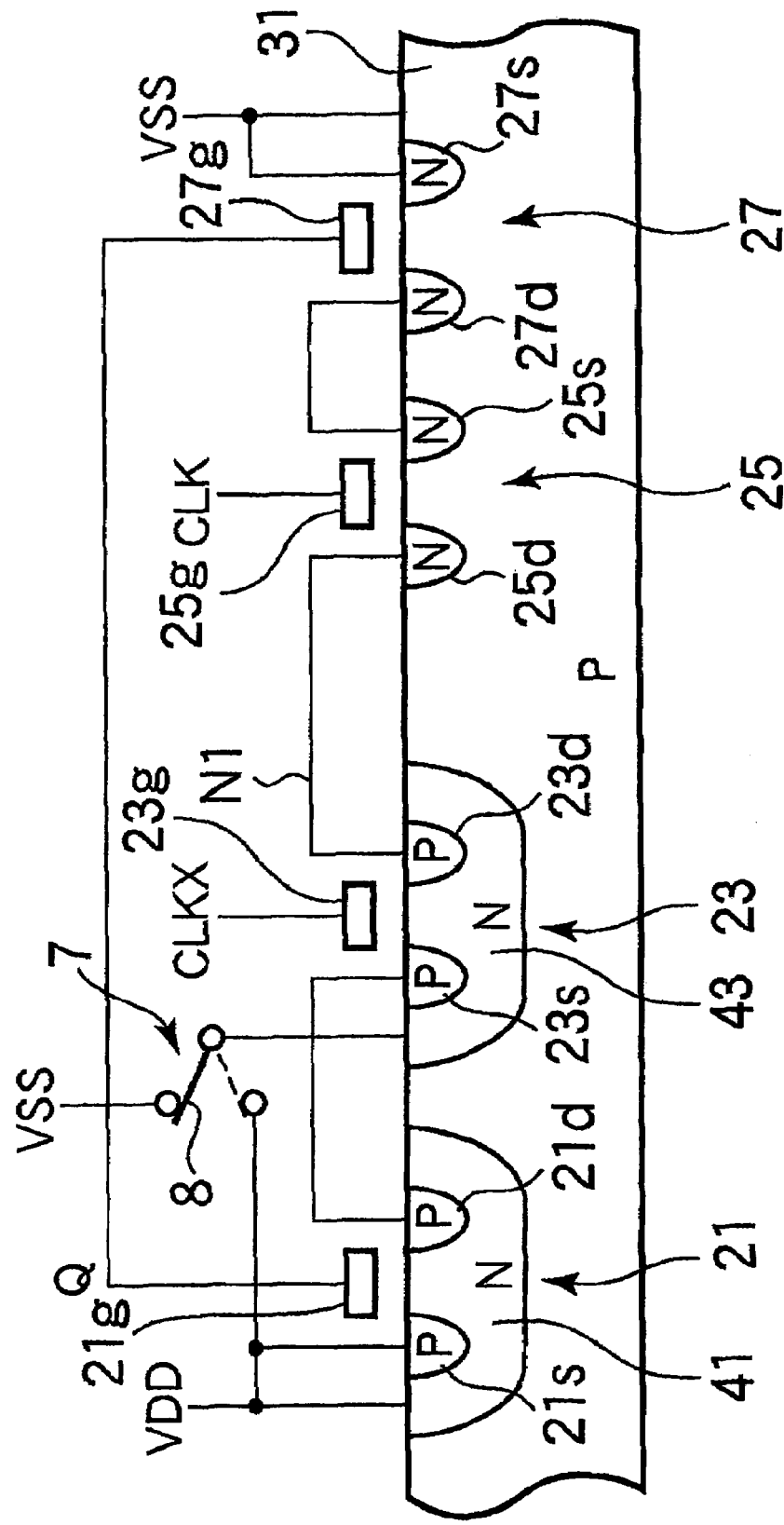
FIG. 12 is a cross sectional view schematically showing a configuration of a gated inverter circuit 20 included in a state retaining circuit 5.

FIG. 12 is a cross sectional view schematically showing a configuration of the gated inverter circuit 20 included in the state retaining circuit 5. As shown in FIG. 12, the gated inverter circuit 20 includes a p-type silicon substrate 31 connected to the ground terminal and to which a back bias is applied. PMOSFETs 21, 23 and NMOSFETs 25, 27 are aligned and formed on the silicon substrate 31. The PMOSFET 21 includes: an n-well back gate region 41 formed in a p-type impurity region of the silicon substrate 31; a gate electrode 21g disposed on the back gate region 41 via an insulation film (not shown); and a source region 21s and a drain region 21d that are p-type impurity diffused layers respectively formed on both sides of a channel region formed on the n-well at a lower layer of the gate electrode 21g. The back gate region 41 is connected to the power supply terminal via a back gate terminal, not shown, and a back gate bias is applied thereto. The source region 21s is connected to the power supply terminal via a source terminal, not shown.

The PMOSFET 23 includes: an n-well back gate region 43 formed in a p-type impurity region of the silicon substrate 31; a gate electrode 23g disposed on the back gate region 43 via an insulation film (not shown); and a source region 23s and a drain region 23d that are p-type impurity diffused layers respectively formed on both sides of a channel region formed on the n-well at a lower layer of the gate electrode 23g. The switch circuit 8 included in the clear circuit 7 is connected via a back gate terminal, not shown, to the back gate region 43. The source region 23s is connected to the drain region 21d of the PMOSFET 21 via a source terminal, not shown. The clock signal CLKX is inputted via a gate terminal, not shown, to the gate electrode 23g.

The NMOSFET 25 includes: a gate electrode 25g disposed on the p-type impurity region of the silicon substrate 31 via an insulation film (not shown); and a drain region 25d and a source region 25s that are n-type impurity diffused layers respectively formed on both sides of a channel region formed on the p-type impurity region at a lower layer of the gate electrode 25g. The drain region 25d is connected to the drain region 23d of the PMOSFET 23 via a drain terminal, not shown. The connection point of the drain regions 23d and 25d become a node N1. The clock signal CLK is inputted via a gate terminal, not shown, to the gate electrode 25g.

The NMOSFET 27 includes: a gate electrode 27g disposed on the p-type impurity region of the silicon substrate 31 via an insulation film (not shown); and a drain region 27d and a source region 27s that are n-type impurity diffused layers respectively formed on both sides of a channel region formed in the p-type impurity region at a lower layer of the gate electrode 27g. The drain region 27d is connected to the source region 25s of the NMOSFET 25 via a drain terminal, not shown. The source region 27s is connected to the ground terminal via a source terminal, not shown. The gate electrode 27g is connected to the gate electrode 21g of the PMOSFET 21 via a gate terminal, not shown. An output signal Q is outputted from the gate electrodes 21g and 27g.

Next, operations of the latch circuit 1 according to the present example will be described with reference to FIGS. 11 and 12. With the latch circuit 1 according to the present example, the back gate terminal of the PMOSFET 23 is connected to the power supply terminal via the switch circuit 8. Thus, since the normal operation of the latch circuit 1 according to the present example is the same as that of example 1 described above, a description thereof will be omitted.

Next, a clearing operation of the latch circuit 1 according to the present example will be described. As shown in FIG. 11, in the present example, the latch circuit 1 is capable of changing the logical level of the input signal at the node N1 to a clear level that is a low level to clear the output signal Q to a high level.

As shown in FIG. 11, in the event that a clear signal CLR, not shown, is inputted to the clear circuit 7 when the logical level at the node N1 is at a high (H) level and the logical level of the output signal Q is at a low (L) level, the switch circuit 8 is switched from the power supply terminal-side to the ground terminal-side. Consequently, the back gate terminal of the PMOSFET 23 is connected to the ground terminal.

As shown in FIG. 11, a current path including the power supply terminal, PMOSFETs 21, 23 of the gated inverter circuit 20, the switch circuit 8 and the ground terminal is formed through which a current I flows. Meanwhile, as shown in FIG. 12, when the back gate terminal of the PMOSFET 23 is connected to the ground terminal, the back gate region 43 is also connected to the ground terminal and changes to a low level. In addition, the node N1 is at a high level. Therefore, through a p-n junction formed by the drain region 23d and the back gate region 43 of the PMOSFET 23, the potential of the node N1 drops and becomes substantially equal to the reference potential VSS. Since the logical level of the input signal at the node N1 changes to the low (L) level, the inverter circuit 10 outputs a high-level signal.

At this point, since a latch loop is formed in the state retaining circuit 5, the output signal from the inverter circuit 10 is retained in the state retaining circuit 5 by the latch loop, and the logical level of the output signal Q is cleared to a high level. Subsequently, the switch circuit 8 is switched to the power supply terminal-side. Since the gated inverter circuit 30 is in a non-output state, the state retaining circuit 5 retains an output signal Q whose logical level is a high level and continues output thereof without being depended on by the external signal D.

In the present example, while a reference potential VSS is applied to one terminal of the switch circuit 8 during clearing operation, applying a voltage that is lower than the threshold voltage of the PMOSFET (p-type transistor) 17 of the inverter circuit 10 should suffice. In this case, during a reset operation, the potential of the input signal at the node N1 drops below the threshold voltage of the PMOSFET 17 via the back gate terminal of the PMOSFET 23. Consequently, since the inverter circuit 10 inverts a low-level input signal to output a high-level signal, the output signal Q may be cleared to a high level.

As described above, according to the present example, the latch circuit 1 is capable of changing the logical level of an input signal at the node N1 to a clear level that is a low level via the state retaining circuit 5. In other words, because the latch circuit 1 is capable of changing the input signal at the node N1 to a low level via the back gate terminal of the PMOSFET 23, similar advantages to the latch circuit 1 according to example 1 may be achieved.

Example 4 of the Embodiment

Figure 13:
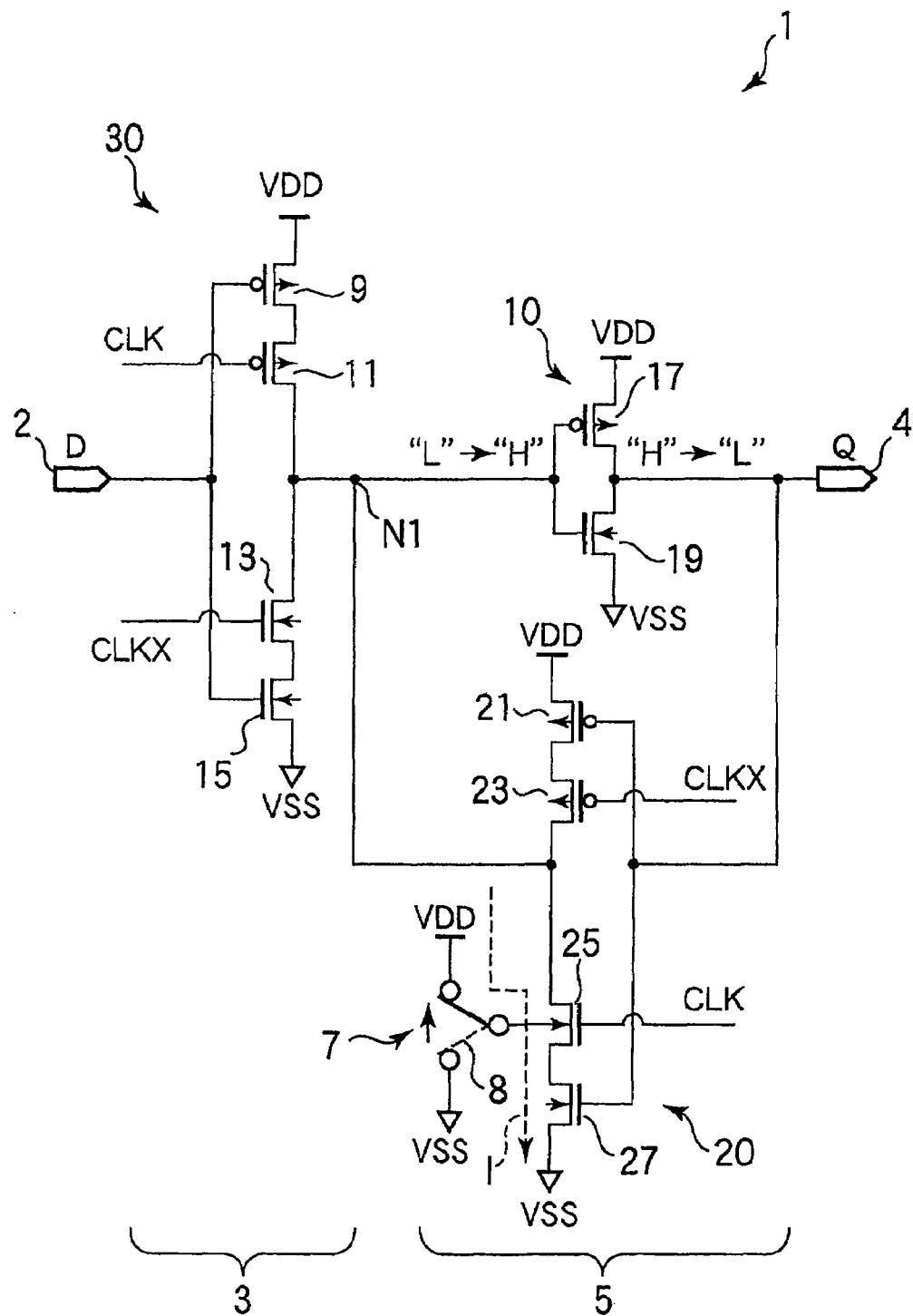
FIG. 13 is a diagram showing an exemplary circuit configuration of a latch circuit 1 according to example 4.

Next, a latch circuit 1 according to example 4 of the embodiment will be described with reference to FIG. 13. FIG. 13 shows an example of a circuit configuration of the latch circuit 1 according to the present example. In the latch circuit 1 according to example 3 described above, the clear circuit 7 is connected to the back gate terminal of the PMOSFET 23. In comparison thereto, as shown in FIG. 13, in the latch circuit 1 according to the present example, the clear circuit 7 is connected to the NMOSFET 25. With the exception of the position to which the clear circuit 7 is connected, the configuration of the latch circuit 1 according to the present example is the same as that of the latch circuit 1 according to example 1. In consideration thereof, portions in which the configuration of the latch circuit 1 according to the present example is the same as that of the latch circuit 1 according to example 1 shall be omitted from the following description.

The clear circuit 7 is connected to a back gate terminal of the NMOSFET 25. Therefore, a retaining path connection/disconnection circuit is a transistor that controls connection/disconnection to the ground terminal based on the clock signal CLK, and includes a gated inverter circuit (second gated inverter circuit) 20 that uses an NMOSFET (second transistor) 25 having a gate terminal to which the clock signal CLK is inputted and a back gate terminal to which the clear circuit 7 is connected.

Next, operations of the latch circuit 1 according to the present example will be described with reference to FIG. 13. With the latch circuit 1 according to the present example, the back gate terminal of the NMOSFET 25 is connected to the ground terminal via the switch circuit 8. Thus, since the normal operation of the latch circuit 1 according to the present example is the same as that of example 1 described above, a description thereof will be omitted.

Next, a clearing operation of the latch circuit 1 according to the present example will be described. As shown in FIG. 13, in the present example, the latch circuit 1 is capable of changing the logical level of the input signal at the node N1 to a clear level that is a high level to clear the output signal Q to a low level.

As shown in FIG. 13, in the event that a clear signal CLR, not shown, is inputted to the clear circuit 7 when the logical level at the node N1 is at a low (L) level and the logical level of the output signal Q is at a high (H) level, the switch circuit 8 is switched from the ground terminal-side to the power supply terminal-side. Consequently, the back gate terminal of the NMOSFET 25 is connected to the power supply terminal.

When the back gate terminal of the NMOSFET 25 is connected to the power supply terminal, a current path including the power supply terminal, the switch circuit 8, NMOSFETs 25, 27 of the gated inverter circuit 20, and the ground terminal is formed through which a current I flows. Therefore, through a p-n junction formed by the back gate region (not shown) and the drain region (not shown) of the NMOSFET 25, the potential of the node N1 rises and becomes substantially equal to the power supply voltage VDD. Consequently, since the logical level of the input signal at the node N1 changes to a high (H) level, the inverter circuit 10 outputs a low-level signal.

At this point, since a latch loop is formed in the state retaining circuit 5, the output signal from the inverter circuit 10 is retained in the state retaining circuit 5 by the latch loop, and the logical level of the output signal Q is cleared to a low level. Subsequently, the switch circuit 8 is switched to the ground terminal-side. Since the gated inverter circuit 30 is in a non-output state, the state retaining circuit 5 retains an output signal Q whose logical level is a low level and continues output thereof without being depended on by the external signal D.

In the present example, while a power supply voltage VDD is applied to one terminal of the switch circuit 8 during a clearing operation, applying a voltage that is higher than the threshold voltage of the NMOSFET (n-type transistor) 19 of the inverter circuit 10 should suffice. In this case, during a reset operation, the potential of the input signal at the node N1 rises above the threshold voltage of the NMOSFET 19 via the back gate terminal of the NMOSFET 25. Consequently, since the inverter circuit 10 inverts a high-level input signal to output a low-level signal, the output signal Q may be cleared to a low level.

As described above, according to the present example, the latch circuit 1 is capable of changing the logical level of an input signal at the node N1 to a clear level that is a high level via the state retaining circuit 5. In other words, because the latch circuit 1 is capable of changing the input signal at the node N1 to a high level via the back gate terminal of the NMOSFET 25, similar advantages to the latch circuit 1 according to example 2 may be achieved.

Example 5 of the Embodiment

Figure 14:
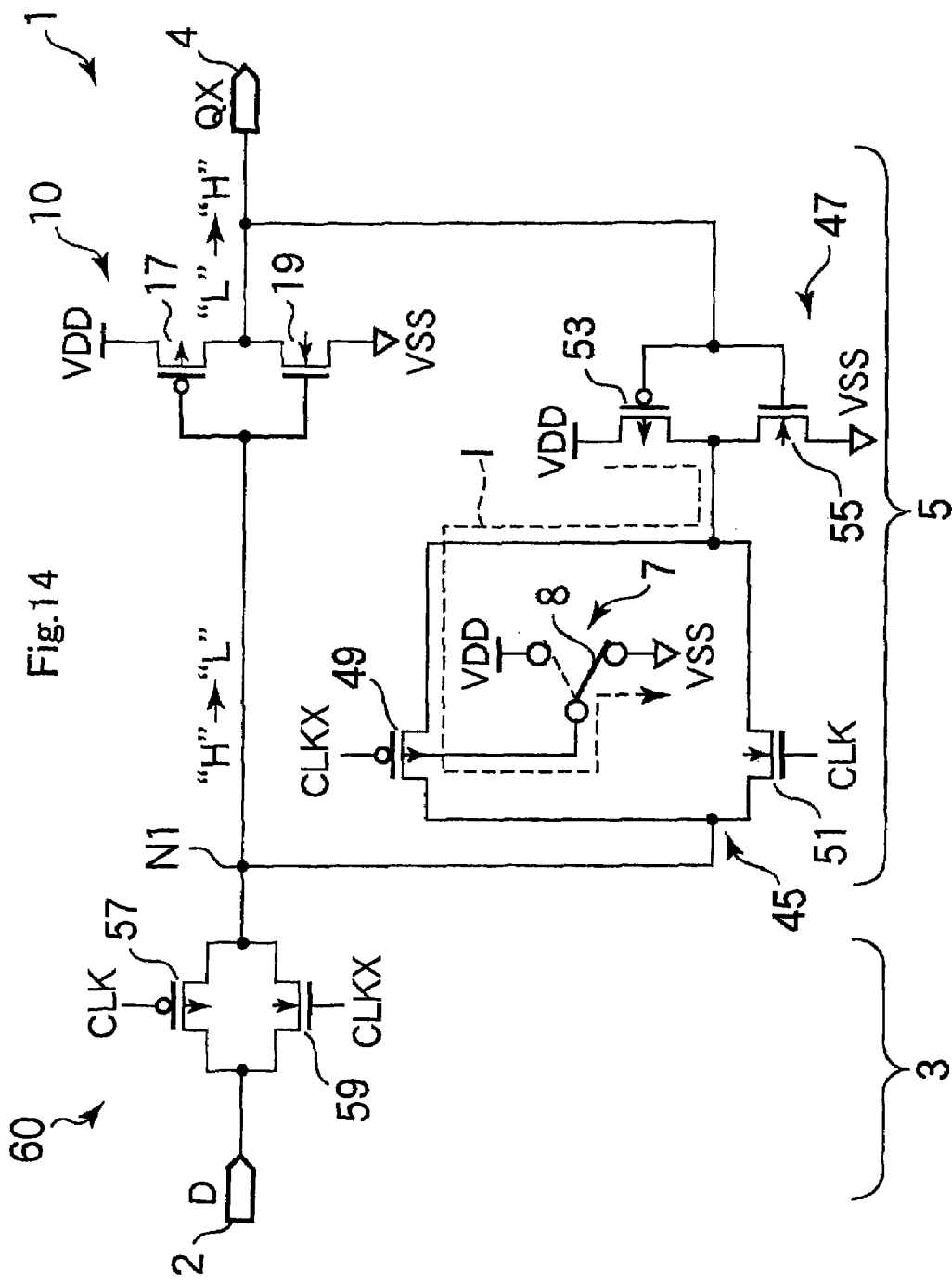
FIG. 14 is a diagram showing an exemplary circuit configuration of a latch circuit 1 according to example 5.

Next, a latch circuit 1 according to example 5 of the embodiment will be described with reference to FIG. 14. FIG. 14 shows an example of a circuit configuration of the latch circuit 1 according to the present example. In the latch circuit 1 according to examples 1 and 2 described above, the state retaining circuit 5 and the switching circuit 3 respectively include gated inverter circuits 20 and 30. In comparison thereto, as shown in FIG. 9, in the latch circuit 1 according to the present example, the switching circuit 3 is provided with a transfer gate circuit 60 in place of the gated inverter circuit 30. Furthermore, in the latch circuit 1 according to the present example, the state retaining circuit 5 is provided with an inverter circuit 47 and a transfer gate circuit 45 in place of the gated inverter circuit 20. Hereinafter, only portions in which the configuration of the latch circuit 1 according to the present example differs from that of the latch circuit 1 according to example 1 shall be described, and descriptions of similar configurations shall be omitted.

As shown in FIG. 14, the transfer gate circuit 60 includes a PMOSFET 57 and an NMOSFET 59 connected in parallel. A clock signal CLK is inputted to a gate terminal of the PMOSFET 57, while a clock signal CLKX is inputted to a gate terminal of the NMOSFET 59. Source terminals of the PMOSFET 57 and the NMOSFET 59 are connected to each other and connected to an input section 2. Drain terminals of the PMOSFET 57 and the NMOSFET 59 are connected to each other and connected to an input terminal of the state retaining circuit 5. The connection section of an output terminal of the transfer gate circuit 60 and the input terminal of the state retaining circuit 5 is a node N1.

A retaining path connection/disconnection circuit provided in the state retaining circuit 5 includes the inverter circuit 47 and the transfer gate circuit 45. The inverter circuit 47 includes a PMOSFET 53 and an NMOSFET 55 connected in series between the power supply terminal and the ground terminal. A source terminal of the PMOSFET 53 is connected to the power supply terminal, while a drain terminal thereof is connected to a drain terminal of the NMOSFET 55. A source terminal of the NMOSFET 55 is connected to the ground terminal. Gate terminals of the PMOSFET 53 and the NMOSFET 55 are mutually connected, and are connected to an output terminal of the inverter circuit 10 and to an output section 4. The gate terminals of the PMOSFET 53 and the NMOSFET 55 become input terminals of the inverter circuit 47. The drain terminals of the PMOSFET 53 and the NMOSFET 55 are connected to the input terminal of the transfer gate circuit 45. The drain terminals of the PMOSFET 53 and the NMOSFET 55 become output terminals of the inverter circuit 45.

The transfer gate circuit 49 includes a PMOSFET 49 and an NMOSFET 51 connected in parallel. A clock signal CLKX is inputted to a gate terminal of the PMOSFET 49. A clock signal CLK is inputted to a gate terminal of the NMOSFET 51. Source terminals of the PMOSFET 49 and the NMOSFET 51 are connected to each other and become input terminals. The source terminals are connected to the drain terminals of the PMOSFET 53 and the NMOSFET 55 that are output terminals of the inverter circuit 47. Drain terminals of the PMOSFET 49 and the NMOSFET 51 are connected to each other and become output terminals. The drain terminals are connected to the node N1.

The clear circuit 7 is connected to a back gate terminal of the PMOSFET 49. The clear circuit 7 includes a switch circuit (second switch circuit) 8 connected to the back gate terminal of the PMOSFET 49. The retaining path connection/disconnection circuit includes: the transfer gate circuit 45 using the PMOSFET (second transistor) 49 having a gate terminal to which the clock signal CLKX is inputted and the back gate terminal to which the clear circuit 7 is connected.

Next, operations of the latch circuit 1 will be described with reference to FIG. 9. First, a normal operation of the latch circuit 1 will be described. Since the PMOSFET 57 and the NMOSFET 59 assume on-states when the clock signal CLK is at a low level and the clock signal CLKX is at a high level, the transfer gate circuit 60 assumes a signal output state and outputs an external signal D inputted to the input section 2. The external signal D is inputted to the state retaining circuit 5 as an input signal. At this point, since the PMOSFET 49 and the NMOSFET 51 of the transfer gate circuit 45 assume off-states, the transfer gate circuit 45 assumes a non-output state. Consequently, the output terminal of the transfer gate circuit 45 is in a high-impedance state with respect to the input terminal of the state retaining circuit 5. Therefore, the transfer gate circuit 45 may be considered to be detached from the input terminal of the state retaining circuit 5. In addition, during a normal operation of the latch circuit 1, the switch circuit 8 within the clear circuit 7 is switched to the power supply terminal-side and a power supply voltage VDD is applied to the back gate terminal of the PMOSFET 49.

The input signal inputted to the state retaining circuit 5 is subjected to 180 degrees-phase inversion at the inverter circuit 10, and is then outputted from the output terminal. Since the output terminal is connected to the output section 4, the signal outputted from the inverter circuit 10 is outputted from the output section 4 as an output signal Q that is phase-inverted by 180 degrees with respect to the external signal D that is the input signal.

At this point, if the clock signal CLK assumes a high level state and the clock signal CLKX assumes a low level state, the PMOSFET 57 and the NMOSFET 59 assume off-states, and the transfer gate circuit 60 assumes a non-output state. Meanwhile, the PMOSFET 49 and the NMOSFET 51 assume on-states and the transfer gate circuit 45 assumes a signal output state. Since the transfer gate circuit 45 connects a state retaining path, a latch loop is formed within the state retaining circuit 5 by the inverter circuits 10, 47 and the transfer gate circuit 45.

The signal outputted from the inverter circuit 10 is outputted from the inverter circuit 47 with its phase inverted by 180 degrees. Since the transfer gate circuit 45 outputs the inputted signal without inverting the phase thereof, the signal outputted from the transfer gate circuit 45 is in-phase with the input signal inputted to the inverter circuit 10. This signal that is in-phase with the input signal is inputted to the inverter circuit 10. Meanwhile, since the output terminal of the transfer gate circuit 60 assumes a high-impedance state with respect to the input terminal of the state retaining circuit 5, the output terminal of the transfer gate circuit 60 may be considered to be detached from the input terminal. Therefore, the state retaining circuit 5 is capable of retaining the state of the logical level of the output signal Q based on the input signal already inputted without being depended on by the logical level of the external signal D inputted to the input section 2.

Next, a clearing operation of the latch circuit 1 will be described. In the same manner as the latch circuit 1 of examples 1 to 4 described above, the latch circuit 1 according to the present example is arranged so that the clear circuit 7 changes the logical level of an input signal at the node N1 to a clear level when the switching circuit 3 is in a non-output state. Therefore, during a clearing operation, the clock signal CLK is at a high level while the clock signal CLKX is at a low level. As shown in FIG. 14, in the present example, the latch-circuit 1 is capable of changing the logical level of the input signal at the node N1 to a low level to clear the output signal Q to a high level.

As shown in FIG. 14, in the event that a clear signal CLR, not shown, is inputted to the clear circuit 7 when the logical level at the node N1 is at a high (H) level and the logical level of the output signal Q is at a low (L) level, the switch circuit 8 is switched from the power supply terminal-side to the ground terminal-side. Consequently, the back gate terminal of the PMOSFET 49 is connected to the ground terminal. As a result, a current path including the power supply terminal, the PMOSFET 53 of the inverter circuit 47, the PMOSFET 49, the switch circuit 8 and the ground terminal is formed through which a current I flows. A p-n junction is formed by the drain region and the back gate region (both not shown) respectively connected to the drain terminal and the back gate terminal of the PMOSFET 49. Through the p-n junction, the potential of the node N1 drops and becomes substantially equal to the reference potential VSS. Therefore, since the logical level of the input signal at the node N1 changes to the low (L) level, the inverter circuit 10 outputs a high-level signal.

Because the clock signal CLK is at a high level and the clock signal CLKX is at a low level, a latch loop is formed within the state retaining circuit 5. The input signal whose logical level at the node N1 has changed to a low level based on the clearing operation of the clear circuit 7 is retained in the state retaining circuit 5 by the latch loop, and the logical level of the output signal Q is cleared to a high level. Subsequently, the switch circuit 8 is switched to the power supply terminal-side. Even when the switch circuit 8 is switched to the power supply terminal-side, since the transfer gate circuit 60 is in a non-output state, the state retaining circuit 5 retains an output signal Q whose logical level is a high level and continues output thereof without depending on the external signal D.

In the present example, while a reference potential VSS is applied to one terminal of the switch circuit 8, a voltage that is lower than the threshold voltage of the PMOSFET (p-type transistor) 17 of the inverter circuit 10 may be applied instead in the same manner as the examples 1 to 3 described above. In this case, during a reset operation, the clear circuit 7 is able to change the logical level of the input signal to a low level by bringing the potential of the input signal below the threshold voltage of the PMOSFET 17 of the inverter circuit 10 via the back gate terminal of the PMOSFET 49. Consequently, since the inverter circuit 10 outputs a high-level signal, the output signal Q is cleared to a high level.

As described above, according to the present example, since the latch circuit 1 is capable of changing the input signal at the node N1 to a low level via the back gate terminal of the PMOSFET 49, there is no more need to dispose a NOR circuit or the like for clearing the output signal Q on the signal path as is the case with the conventional clear function-added D latch circuit 301. Consequently, the latch circuit 1 according to the present example achieves similar advantages to the latch circuit 1 according to examples 1 to 3.

Example 6 of the Embodiment

Figure 15:
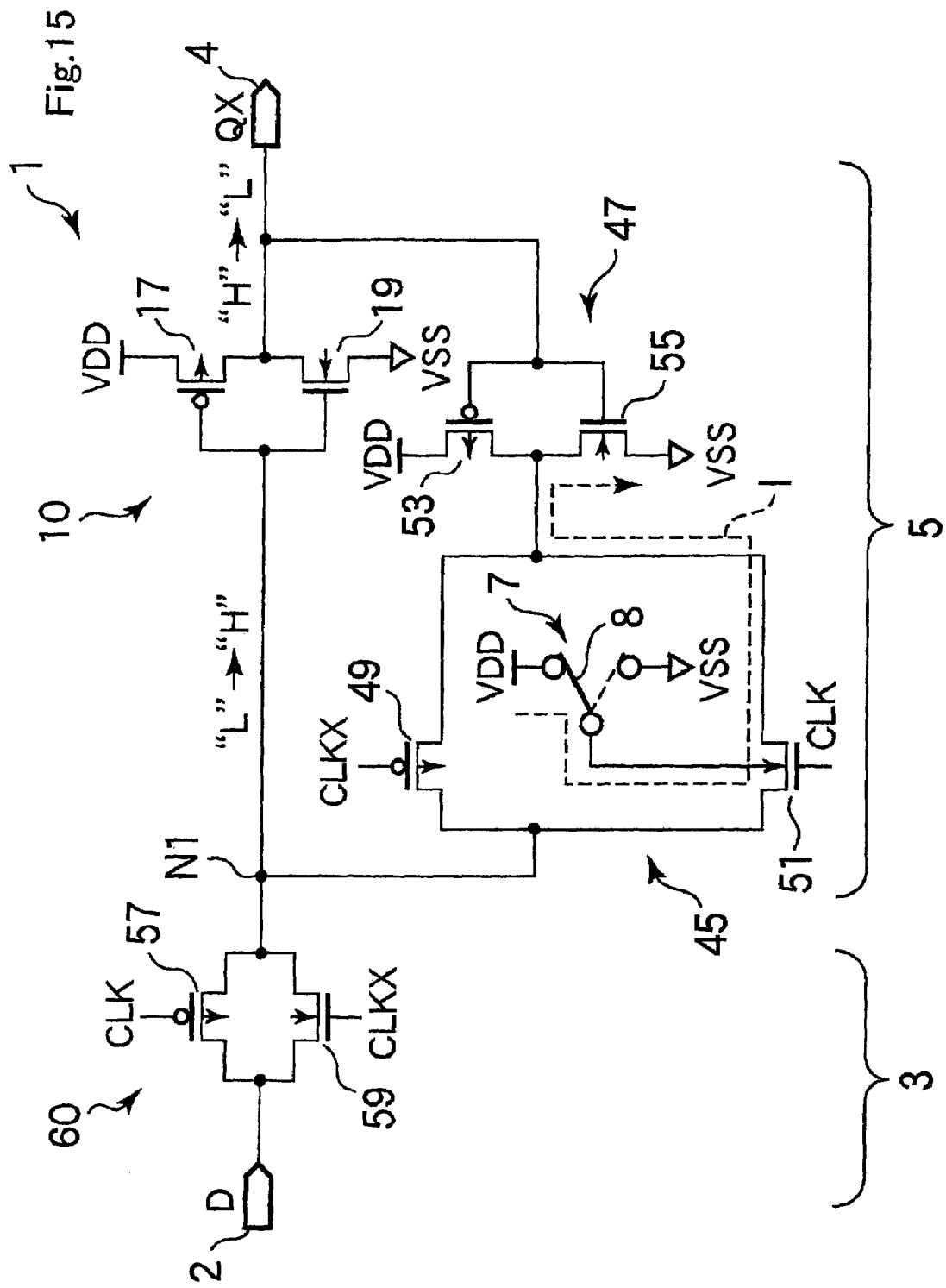
FIG. 15 is a diagram showing an exemplary circuit configuration of a latch circuit 1 according to example 6.

Next, a latch circuit 1 according to example 6 of the embodiment will be described with reference to FIG. 15. FIG. 15 shows an example of a circuit configuration of the latch circuit 1 according to the present example. In the latch circuit 1 according to example 5 described above, the clear circuit 7 is connected to the back gate terminal of the PMOSFET 49. In comparison thereto, as shown in FIG. 15, in the latch circuit 1 according to the present example, the clear circuit 7 is connected to a back gate terminal of an NMOSFET 51. With the exception of the position to which the clear circuit 7 is connected, the configuration of the latch circuit 1 according to the present example is the same as that of the latch circuit 1 according to example 5. Thus, a description thereof shall be omitted.

The clear circuit 7 includes a switch circuit (second switch circuit) 8 connected to the back gate terminal of the NMOSFET 51. A retaining path connection/disconnection circuit includes: a transfer gate circuit 45 using the NMOSFET (second transistor) 51 having a gate terminal to which the clock signal CLK is inputted and a back gate terminal to which the clear circuit 7 is connected.

Next, operations of the latch circuit 1 according to the present example will be described with reference to FIG. 15. With the latch circuit 1 according to the present example, the back gate terminal of the NMOSFET 51 is connected to the ground terminal via the switch circuit 8. Thus, since the normal operation of the latch circuit 1 according to the present example is the same as that of example 5 described above, a description thereof shall be omitted.

Next, a clearing operation of the latch circuit 1 according to the present example will be described. As shown in FIG. 15, in the present example, the latch circuit 1 is capable of changing the logical level of the input signal at the node N1 to a clear level that is a high level to clear the output signal Q to a low level.

As shown in FIG. 15, in the event that a clear signal CLR, not shown, is inputted to the clear circuit 7 when the logical level at the node N1 is at a low (L) level and the logical level of the output signal Q is at a high (H) level, the switch circuit 8 is switched from the ground terminal-side to the power supply terminal-side. Consequently, the back gate terminal of the NMOSFET 51 is connected to the power supply terminal. As a result, a current path including the power supply terminal, the switch circuit 8, the NMOSFET 51, the NMOSFET 55 of an inverter circuit 47, and the ground terminal is formed through which a current I flows. A p-n junction is formed by the back gate region and the drain region (both not shown) respectively connected to the back gate terminal and the drain terminal of the NMOSFET 51. Through this p-n junction, the potential of the node N1 rises and becomes substantially equal to the power supply voltage VDD. Consequently, since the logical level of the input signal at the node N1 changes to a high (H) level, the inverter circuit 10 outputs a low-level signal.

Because the clock signal CLK is at a high level and the clock signal CLKX is at a low level, a latch loop is formed within the state retaining circuit 5. Based on a clearing operation of the clear circuit 7, the output signal from the inverter circuit 10 is retained in the state retaining circuit 5 by the latch loop, and the logical level of the output signal Q is cleared to a low level. Subsequently, the switch circuit 8 is switched to the ground terminal-side. Even when the switch circuit 8 is switched to the ground terminal-side, since the transfer gate circuit 60 is in a non-output state, the state retaining circuit 5 retains an output signal Q whose logical level is a low level and continues output thereof without being depended on by the external signal D.

In the present example, while the power supply voltage VDD is applied to one terminal of the switch circuit 8, a voltage that is higher than the threshold voltage of the NMOSFET (n-type transistor) 19 of the inverter circuit 10 may be applied instead in the same manner as in examples 2 and 4 described above. In this case, during a reset operation, the clear circuit 7 is able to change the logical level of the input signal to a high level by raising the potential of the input signal above the threshold voltage of the NMOSFET 19 of the inverter circuit 10 via the back gate terminal of the NMOSFET 51. Consequently, since the inverter circuit 10 outputs a low-level signal, the output signal Q is cleared to a low level.

As described above, according to the present example, since the latch circuit 1 is capable of changing the input signal at the node N1 to a high level via the back gate terminal of the NMOSFET 51, there is no more need to dispose a NOR circuit or the like for clearing the output signal Q on the signal path as is the case with the conventional clear function-added D latch circuit 301. Consequently, the latch circuit 1 according to the present example achieves similar advantages to the latch circuit 1 according to examples 2 and 4.

Example 7 of the Embodiment

Figure 16:
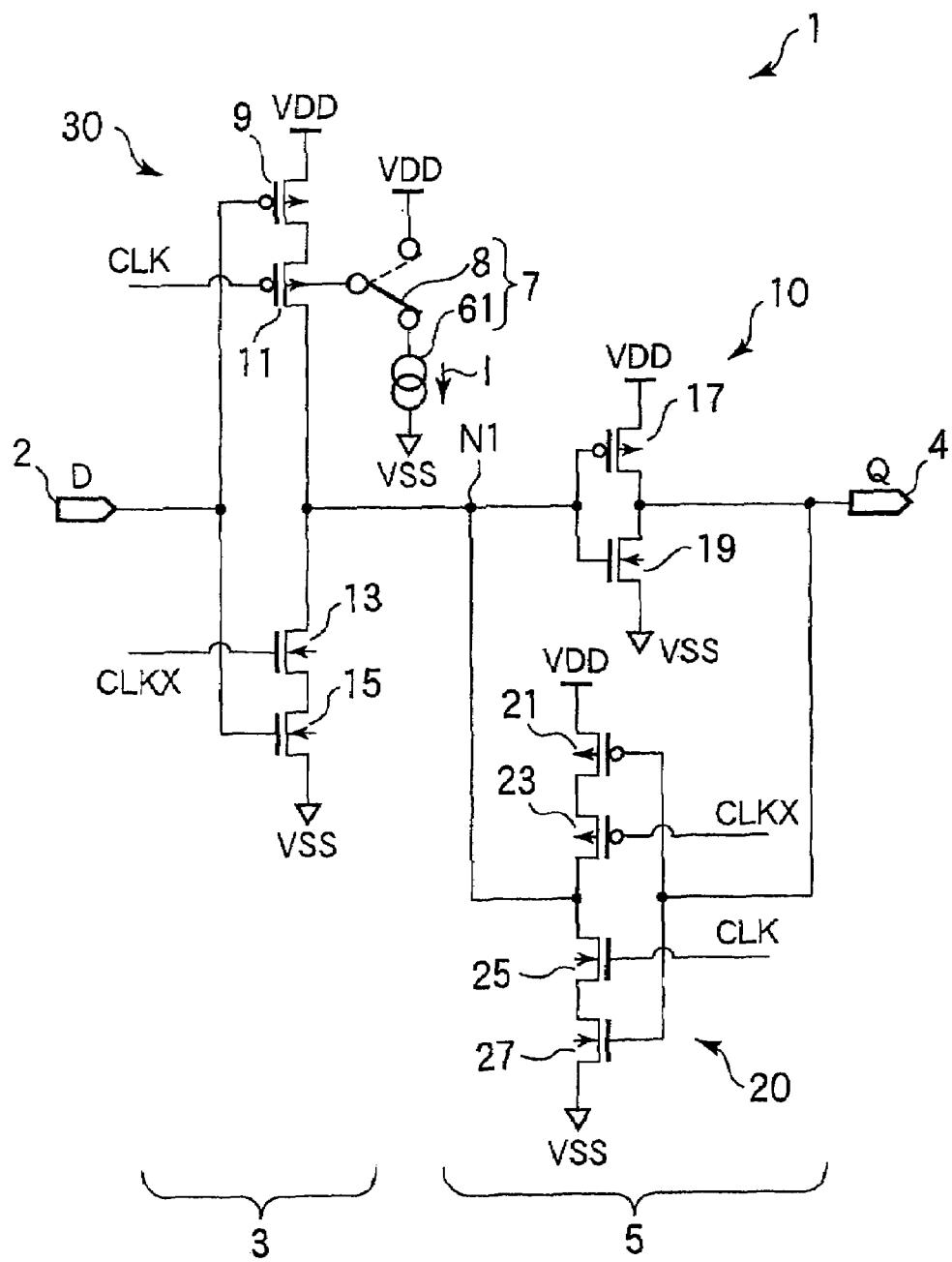
FIG. 16 is a diagram showing an exemplary circuit configuration of a latch circuit 1 according to example 7.

Next, a latch circuit 1 according to example 7 of the embodiment will be described with reference to FIG. 16. FIG. 16 shows an example of a circuit configuration of the latch circuit 1 according to the present example. The clear circuit 7 of the latch circuit 1 according to example 1 described above includes the switch circuit 8 connected to the back gate terminal of the PMOSFET 11. In comparison thereto, the latch circuit 1 according to the present example includes a clear circuit 7 having a switch circuit (first switch circuit) 8, and a current source (first current source) 61 connected between the switch circuit 8 and the ground terminal. With the exception of the configuration of the clear circuit 7, the configuration of the latch circuit 1 according to the present example is the same as that of the latch circuit 1 according to example 1. Thus, a description thereof shall be omitted.

Next, operations of the latch circuit 1 according to the present example will be described with reference to FIG. 16. Since the normal operation of the latch circuit 1 according to the present example is the same as that in example 1 described above, a description thereof shall be omitted. Next, a clearing operation of the latch circuit 1 will be described briefly. Since the clearing operation of the latch circuit 1 according to the present example is substantially the same as that in example 1 described above, only points that differ shall be described.

When a clear signal CLR, not shown, is inputted to the clear circuit 7, the switch circuit 8 is switched from the power supply terminal-side to the current source 61-side. Consequently, by means of a current path formed by the power supply terminal, the PMOSFETs 21 and 23 of the gated inverter circuit 20, the node N1, the PMOSFET 11 of the gated inverter circuit 30, and the switch circuit 8, the current source 61 inside the clear circuit 7 takes a current I into the ground terminal-side. Assuming that the on-resistances of the PMOSFETs 21 and 23 are substantially constant, the potential at the input terminal (node N1) of the state retaining circuit 5 becomes lower as the current value of the current taken in by the current source 61 becomes larger. As a result, the clear circuit 7 is capable of changing the logical level of the input signal at the node N1 to a low level by taking in current via the back gate of the PMOSFET 11 so that the potential of the input signal becomes lower than the threshold voltage of the PMOSFET 17 of the inverter circuit 10. Consequently, in the same manner as described above, the latch circuit 1 is capable of clearing the output signal Q to a high level.

As described above, according to the present example, because the latch circuit 1 is capable of changing the input signal at the node N1 to a low level via the back gate terminal of the PMOSFET 11, similar advantages to the latch circuit 1 according to example 1 may be achieved.

Example 8 of the Embodiment

Figure 17:
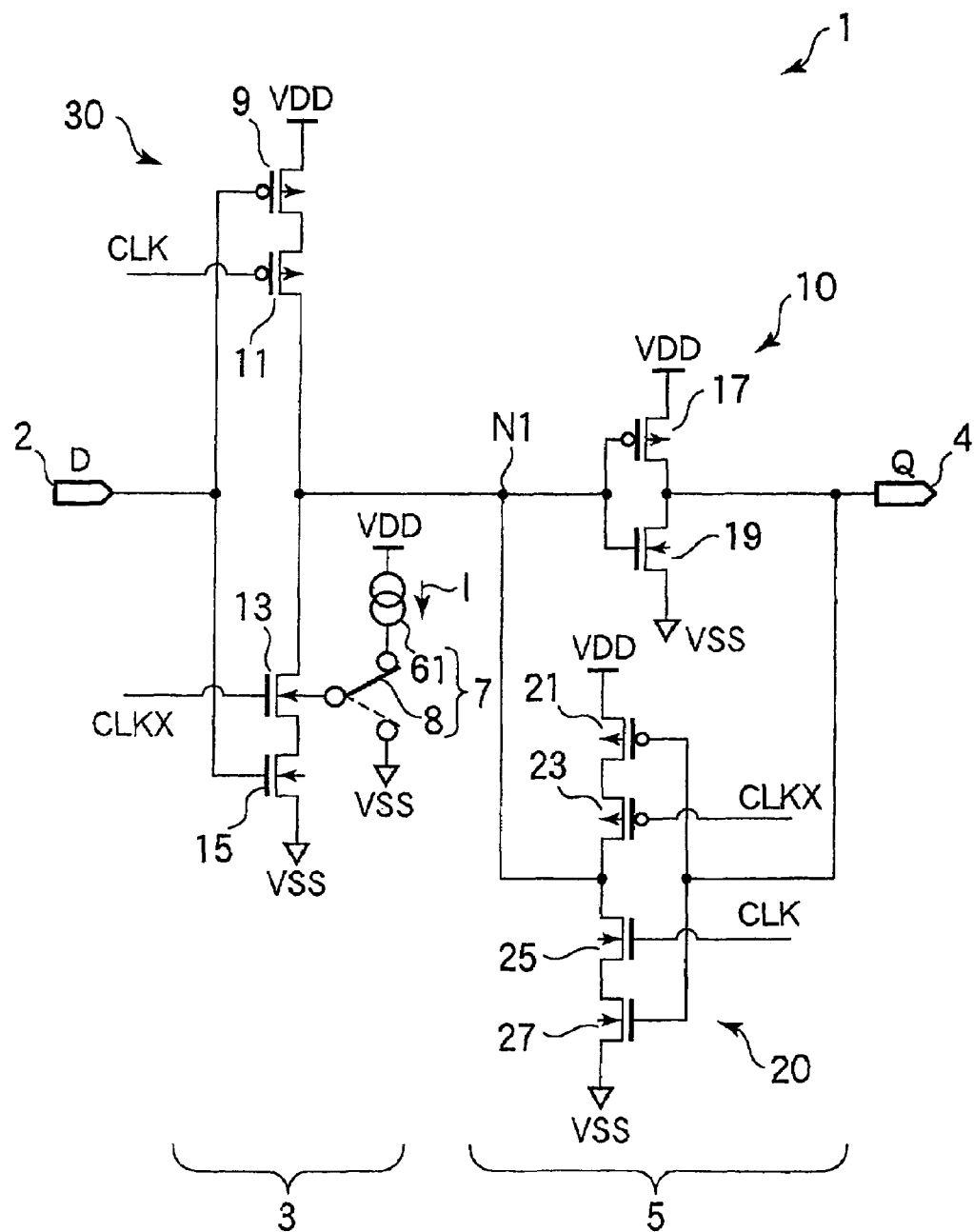
FIG. 17 is a diagram showing an exemplary circuit configuration of a latch circuit 1 according to example 8.

Next, a latch circuit 1 according to example 8 of the embodiment will be described with reference to FIG. 17. FIG. 17 shows an example of a circuit configuration of the latch circuit 1 according to the present example. In the latch circuit 1 according to example 7 described above, the clear circuit 7 includes the switch circuit 8 connected to the back gate terminal of the PMOSFET 11. In comparison thereto, in the latch circuit 1 according to the present example, the clear circuit 7 includes a switch circuit (first switch circuit) 8, and a current source (first current source) 61 connected between the power supply terminal and the switch circuit 8, whereby the clear circuit 7 is connected to a back gate terminal of an NMOSFET 13. With the exception of the fact that the clear circuit 7 is connected to the NMOSFET 13, the configuration of the latch circuit 1 according to the present example is the same as that of the latch circuit 1 according to example 7. Thus, a description thereof shall be omitted.

Operations of the latch circuit 1 according to the present example will now be described with reference to FIG. 17. Since the normal operation of the latch circuit 1 according to the present example is the same as that in example 2 described above, a description thereof shall be omitted. Next, a clearing operation of the latch circuit 1 will be described briefly. Since the clearing operation of the latch circuit 1 according to the present example is substantially the same as that in example 2 described above, only points that differ shall be described.

When a clear signal CLR, not shown, is inputted to the clear circuit 7, the switch circuit 8 is switched from the ground terminal-side to the current source 61-side. Consequently, by means of a current path formed by the switch circuit 8, the NMOSFET 13, the node N1, the NMOSFETs 25 and 27 of the gated inverter circuit 20, and the ground terminal, the current source 61 inside the clear circuit 7 supplies a current I to the node N1-side. Assuming that the on-resistances of the NMOSFETs 25 and 27 are substantially constant, the potential at the input terminal (node N1) of the state retaining circuit 5 becomes higher as the current value of the current supplied by the current source 61 becomes larger. As a result, the clear circuit 7 is capable of changing the logical level of the input signal at the node N1 to a high level by supplying current via the back gate terminal of the NMOSFET 13 so that the potential of the input signal becomes higher than the threshold voltage of the NMOSFET 19 of the inverter circuit 10. Consequently, in the same manner as in example 2 described above, the latch circuit 1 is capable of clearing the output signal Q to a low level.

As described above, according to the present example, because the latch circuit 1 is capable of changing the input signal at the node N1 to a high level via the back gate terminal of the NMOSFET 13, similar advantages to example 2 described above may be achieved.

Example 9 of the Embodiment

Figure 18:
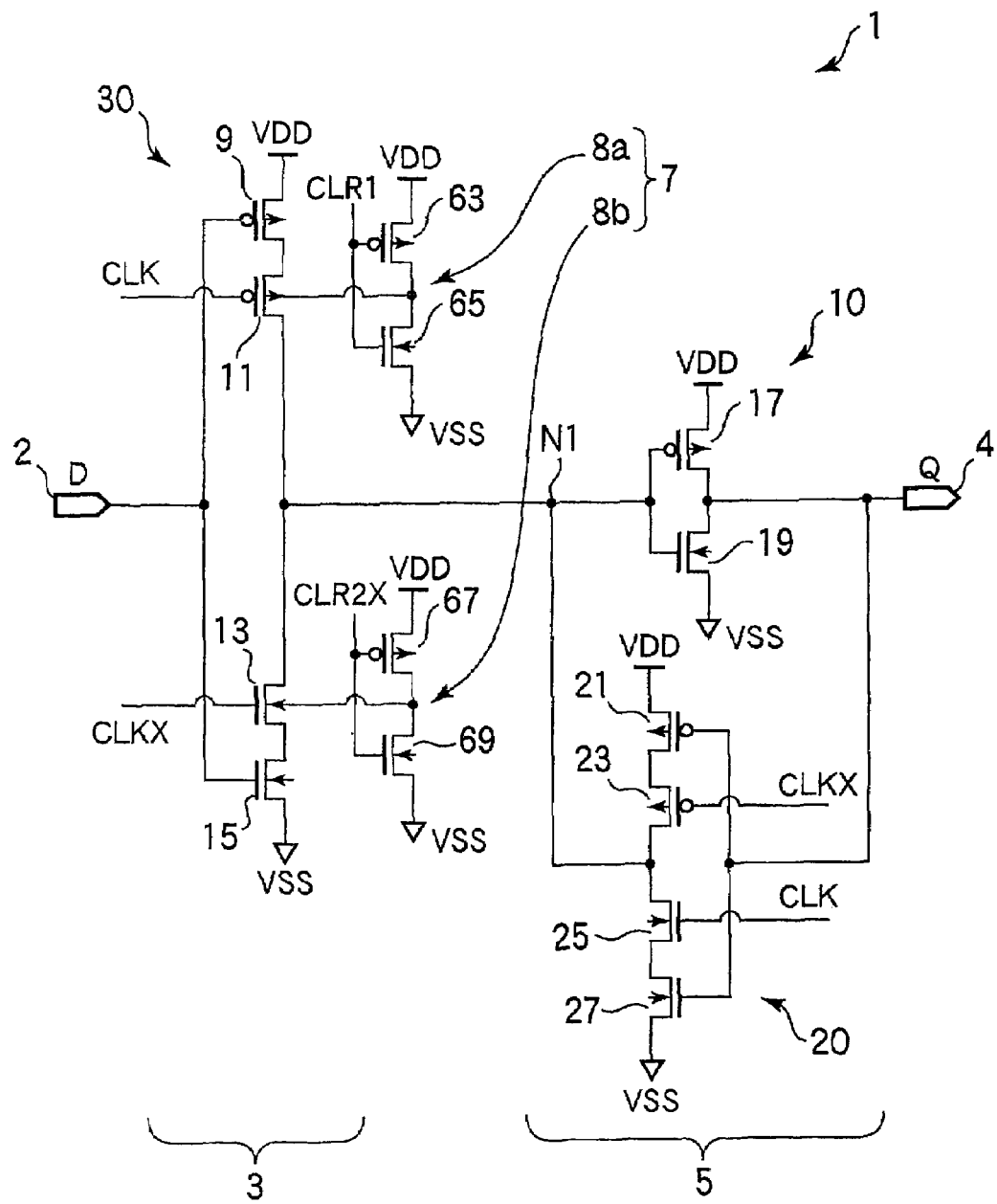
FIG. 18 is a diagram showing an exemplary circuit configuration of a latch circuit 1 according to example 9.

Next, a latch circuit 1 according to example 9 of the embodiment will be described with reference to FIG. 18. FIG. 18 shows an example of a circuit configuration of the latch circuit 1 according to the present example. The latch circuit 1 according to examples 1 to 8 described above includes the clear circuit 7 provided with one switch circuit 8. In comparison thereto, the latch circuit 1 according to the present example includes a clear circuit 7 provided with two switch circuits having CMOS inverter structures. With the exception of the configuration of the clear circuit 7, the configuration of the latch circuit 1 according to the present example is the same as that of the latch circuit 1 according to example 1 described above. Therefore, in the following description, only the configuration of the clear circuit 7 shall be described.

As shown in FIG. 18, the clear circuit 7 includes: a switch circuit (first switch circuit) 8a connected to the back gate terminal of the PMOSFET 11 of the gated inverter circuit (first gated inverter circuit) 30 provided at the switching circuit 3; and a switch circuit (first switch circuit) 8b connected to the NMOSFET 13.

The switch circuit 8a includes a PMOSFET 63 and an NMOSFET 65 connected in series between the power supply terminal and the ground terminal. A source terminal of the PMOSFET 63 is connected to the power supply terminal, while a drain terminal thereof is connected to a drain terminal of the NMOSFET 65. A source terminal of the NMOSFET 65 is connected to the ground terminal. The drain terminals of both FETs 63 and 65 are connected to the back gate terminal of the PMOSFET 1. A clear signal CLR1 is inputted to the gate terminals of both FETs 63 and 65.

The switch circuit 8b includes a PMOSFET 67 and an NMOSFET 69 connected in series between the power supply terminal and the ground terminal. A source terminal of the PMOSFET 67 is connected to the power supply terminal, while a drain terminal thereof is connected to a drain terminal of the NMOSFET 69. A source terminal of the NMOSFET 69 is connected to the ground terminal. The drain terminals of both FETs 67 and 69 are connected to the back gate terminal of the NMOSFET 13. A clear signal CLR2X is inputted to the gate terminals of both FETs 67 and 69.

Next, operations of the latch circuit 1 according to the present example will be described with reference to FIG. 18. During a normal operation of the latch circuit 1 according to the present example, a low-level clear signal CLR1 is inputted, whereby the PMOSFET 63 assumes an on-state and the NMOSFET 65 assumes an off-state. Consequently, the back gate terminal of the PMOSFET 11 is connected to the power supply terminal. Meanwhile, a high-level clear signal CLR2X is inputted, whereby the PMOSFET 67 assumes an off-state and the NMOSFET 69 assumes an on-state. Consequently, the back gate terminal of the NMOSFET 13 is connected to the ground terminal. As a result, the latch circuit 1 according to the present example is capable of performing a normal operation similar to those performed in examples 1 to 8 described above.

Next, a clearing operation of the latch circuit 1 will be described. Since the clearing operation of the latch circuit 1 according to the present example is substantially the same as that in examples 1 and 2 described above, only points that differ shall be described briefly. First, a clearing operation of the latch circuit 1 when an output signal Q is cleared to a high-level state will be described. For instance, in the event that a high-level clear signal CLR1 is inputted to the clear circuit 7 when the logical level at the node N1 is a high level and the logical level of the output signal Q is a low level, the PMOSFET 63 of the switch circuit 8a assumes an off-state and the NMOSFET 65 assumes an on-state. Consequently, the back gate terminal of the PMOSFET 11 is connected to the ground terminal via the NMOSFET 65. Subsequently, by operating in the same manner as in example 1 described above, the latch circuit 1 is capable of clearing the output signal Q to a high level. During the clearing operation described above, the switch circuit 8b maintains the same state as during a normal operation.

Next, a clearing operation of the latch circuit 1 when an output signal Q is cleared to a low-level state will be described. For instance, in the event that a low-level clear signal CLR2X is inputted to the clear circuit 7 when the logical level at the node N1 is a low level and the logical level of the output signal Q is a high level, the PMOSFET 67 of the switch circuit 8b assumes an on-state and the NMOSFET 69 assumes an off-state. Consequently, the back gate terminal of the NMOSFET 13 is connected to the power supply terminal via the PMOSFET 67. Subsequently, by operating in the same manner as in example 2, the latch circuit 1 is capable of clearing the output signal Q to a low level. During the clearing operation described above, the switch circuit 8a maintains the same state as during a normal operation.

As described above, the latch circuit 1 according to the present example is capable of clearing the output signal Q to both high and low levels. In addition, although switch circuits 8a and 8b as control circuits for controlling voltage applied to the back gate terminals of both FETs 11 and 13 are added to the latch circuit 1, a NOR circuit and the like are not added to the signal path. As a result, the latch circuit 1 according to the present example becomes capable of high-speed operations. Furthermore, although the clear circuit 7 is connected to the gated inverter circuit 30 in the present example, similar advantages to the present example may also be achieved by respectively connecting the clear circuit 7 having the circuit configuration of the present example to the back gate terminals of the PMOSFET 23 and the NMOSFET 25 of the gated inverter circuit 20. Moreover, in a case where the output signal Q need only be cleared to either one of a high level and a low level, the latch circuit 1 need only include either one of the switch circuits 8a and 8b inside the clear circuit 7.

Example 10 of the Embodiment

Figure 19:
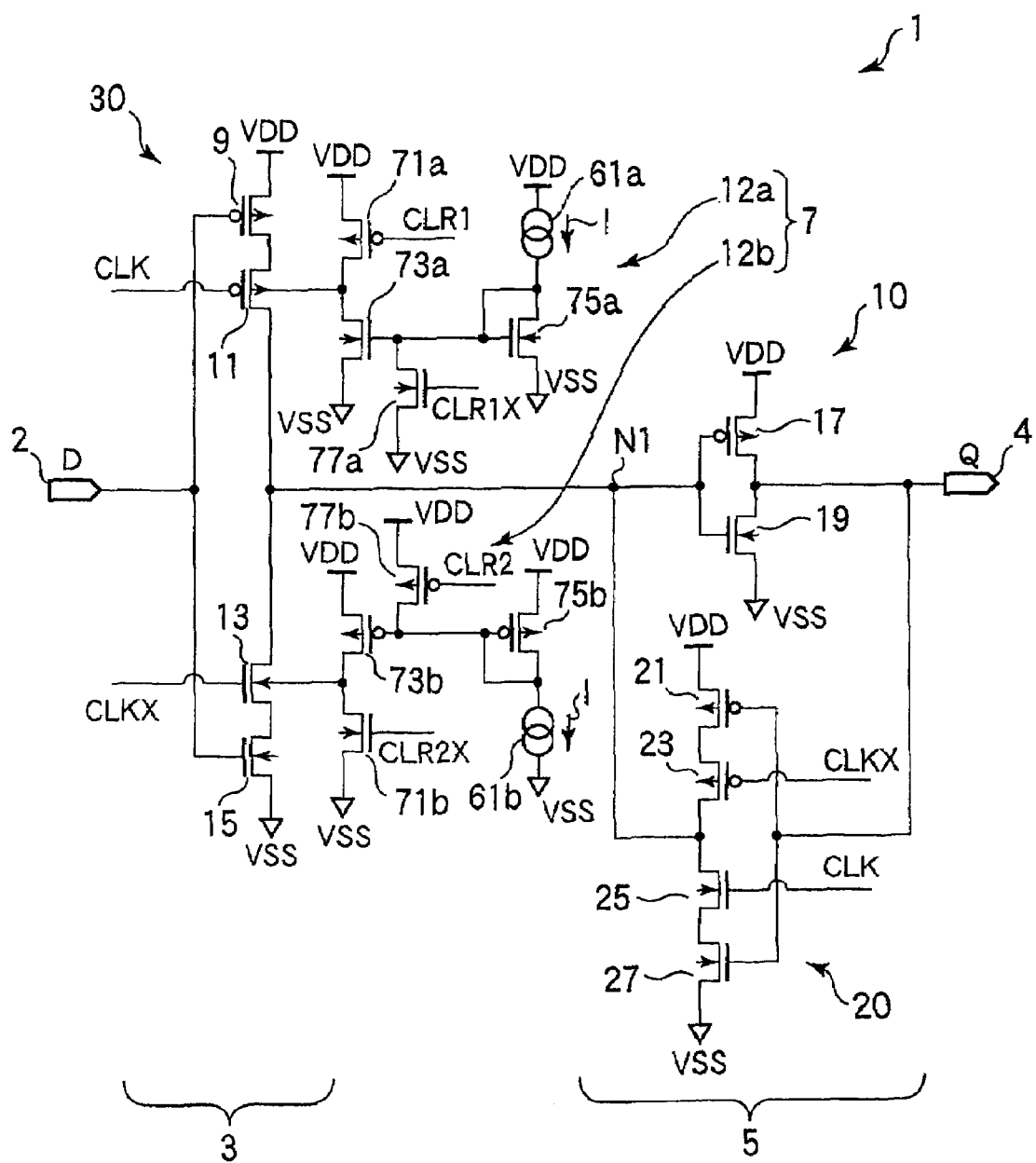
FIG. 19 is a diagram showing an exemplary circuit configuration of a latch circuit 1 according to example 10.

Next, a latch circuit 1 according to example 10 of the embodiment will be described with reference to FIG. 19. FIG. 19 shows an example of a circuit configuration of the latch circuit 1 according to the present example. In the latch circuit 1 according to example 9 described above, the clear circuit 7 includes two switch circuits 8. In comparison thereto, the latch circuit 1 according to the present example is arranged so that the clear circuit 7 includes a current sink circuit having a current mirror circuit, and a current supply circuit. With the exception of the configuration of the clear circuit 7, the configuration of the latch circuit 1 according to the present example is the same as that of the latch circuit 1 according to example 1 described above. Therefore, in the following description, only the configuration of the clear circuit 7 shall be described.

As shown in FIG. 19, the clear circuit 7 includes: a current sink circuit 12a connected to the back gate terminal of the PMOSFET 11 of the gated inverter circuit (first gated inverter circuit) 30 provided at the switching circuit 3; and a current supply circuit 12b connected to the back gate terminal of the NMOSFET 13.

The current sink circuit 12a includes NMOSFETs 73a and 75a whose gate terminals are connected to each other and whose source terminals are connected to the ground terminal. A drain terminal of the NMOSFET 73a is connected to the back gate terminal of the PMOSFET 11. A drain terminal of the NMOSFET 75a is connected to gate terminals of the NMOSFETs 73a and 75a and to the current output terminal of a current source 61a. A current input terminal of the current source 61a is connected to the power supply terminal. The current source 61a is constituted by, for instance, a resistive element or a transistor.

A drain terminal of a PMOSFET 71a is connected to the back gate terminal of the PMOSFET 11 and the drain terminal of the NMOSFET 73a. A source terminal of the PMOSFET 71a is connected to the power supply terminal. A clear signal CLR1 is inputted to a gate terminal of the PMOSFET 71a. A drain terminal of an NMOSFET 77a is connected to the gate terminals of the NMOSFETs 73a and 75a. A source terminal of the NMOSFET 77a is connected to the ground terminal. A clear signal CLR1X is inputted to a gate terminal of the NMOSFET 77. The phases of the clear signal CLR1 and the clear signal CLR1X are inverted with respect to each other. Therefore, when the PMOSFET 71a assumes an on/off state, the NMOSFET 77a also assumes an on/off state. The PMOSFET 71a and the NMOSFET 77a operate in cooperation as a switch circuit (first switch circuit) of the current sink circuit 12a.

The current supply circuit 12b includes PMOSFETs 73b and 75b whose gate terminals are connected to each other and whose source terminals are connected to the power supply terminal. A drain terminal of the PMOSFET 73b is connected to the back gate terminal of the NMOSFET 13. A drain terminal of the PMOSFET 75b is connected to gate terminals of the PMOSFETs 73b and 75b and to a current input terminal of a current source 61b. A current output terminal of the current source 61b is connected to the ground terminal. The current source 61b is constituted by, for instance, a resistive element or a transistor.

A drain terminal of an NMOSFET 71b is connected to the back gate terminal of the NMOSFET 13 and the drain terminal of the PMOSFET 73b. A source terminal of the NMOSFET 71b is connected to the ground terminal. A clear signal CLR2X is inputted to a gate terminal of the NMOSFET 71b. A drain terminal of a PMOSFET 77b is connected to the gate terminals of the PMOSFETs 73b and 75b. A source terminal of the PMOSFET 77b is connected to the power supply terminal. A clear signal CLR2 is inputted to a gate terminal of the PMOSFET 77b. The phases of the clear signal CLR2 and the clear signal CLR2X are inverted with respect to each other. Therefore, when the PMOSFET 77b assumes an on/off state, the NMOSFET 71b also assumes an on/off state. The PMOSFET 77b and the NMOSFET 71b operate in cooperation as a switch circuit (first switch circuit) of the current supply circuit 12b.

Next, operations of the latch circuit 1 according to the present example will be described with reference to FIG. 19. During a normal operation of the latch circuit 1 according to the present example, a low level clear signal CLR1 and a high-level clear signal CLR1X are respectively inputted to the gate terminals, and the PMOSFET 71a and the NMOSFET 77a assume on-states. Consequently, the back gate terminal of the PMOSFET 11 is connected to the power supply terminal. Meanwhile, since the gate terminal of the NMOSFET 73a is connected to the ground terminal via the NMOSFET 77a, the NMOSFET 73a assumes an off-state. Consequently, the back gate terminal is disconnected from the ground terminal.

On the other hand, a low level clear signal CLR2 and a high-level clear signal CLR2X are respectively inputted to the gate terminals, and the PMOSFET 77b and the NMOSFET 71b assume on-states. Consequently, the back gate terminal of the NMOSFET 13 is connected to the ground terminal. Meanwhile, since the gate terminal of the PMOSFET 73b is connected to the power supply terminal via the NMOSFET 77b, the PMOSFET 73b assumes an off-state. Consequently, the back gate terminal is disconnected from the power supply terminal.

As seen, during a normal operation, the clear circuit 7 is capable of connecting the back gate terminal of the PMOSFET 11 to the power supply terminal and connecting the back gate terminal of the NMOSFET 13 to the ground terminal. As a result, the latch circuit 1 according to the present example is capable of performing a normal operation similar to that performed in example 1 described above.

Next, a clearing operation of the latch circuit 1 will be described. Since the clearing operation of the latch circuit 1 according to the present example is substantially the same as that in examples 7 and 8 described above, only points that differ shall be described briefly. First, a clearing operation of the latch circuit 1 when an output signal Q is cleared to a high-level state will be described. For instance, in the event that a high-level clear signal CLR1 and a low-level clear signal CLR1X are inputted to the clear circuit 7 when the logical level at the node N1 is a high level and the logical level of the output signal Q is a low level, the PMOSFET 71a and the NMOSFET 77a of the current sink circuit 12a assume off-states. Consequently, the back gate terminal of the PMOSFET 11 is disconnected from the power supply terminal. Meanwhile, since the NMOSFET 73a assumes an on-state, the back gate terminal of the PMOSFET 11 is connected to the ground terminal via the NMOSFET 73a. Furthermore, a current mirror circuit is configured by the current source 61a and the NMOSFETs 73a and 75a. As a result, the current sink circuit 12a is capable of taking in a current whose current value is substantially the same as the current I supplied by the current source 61a from the node N1-side via the back gate of the PMOSFET 11. Therefore, by operating in the same manner as in example 7 described above, the latch circuit 1 according to the present example is capable of clearing the output signal Q to a high level. During the clearing operation described above, the current supply circuit 12b maintains the same state as during a normal operation.

Next, a clearing operation of the latch circuit 1 when an output signal Q is cleared to a low-level state will be described. For instance, in the event that a high-level clear signal CLR2 and a low-level clear signal CLR2X are inputted to the clear circuit 7 when the logical level at the node N1 is a low level and the logical level of the output signal Q is a high level, the NMOSFET 71b and the PMOSFET 77b of the current supply circuit 12b assume off-states. Consequently, the back gate terminal of the PMOSFET 11 is disconnected from the ground terminal. Meanwhile, since the PMOSFET 73b assumes an on-state, the back gate terminal of the PMOSFET 11 is connected to the power supply terminal via the PMOSFET 73b. Furthermore, a current mirror circuit is configured by the current source 61b and the PMOSFETs 73b and 75b. As a result, the current supply circuit 12b is capable of supplying a current whose current value is substantially the same as the current I taken in by the current source 61b to the node N1-side via the back gate of the NMOSFET 13. Therefore, by operating in the same manner as in example 8 described above, the latch circuit 1 according to the present example is capable of clearing the output signal Q to a low level. During the clearing operation described above, the current sink circuit 12a maintains the same state as during a normal operation.

As described above, the latch circuit 1 according to the present example is capable of clearing the output signal Q to both high and low levels. Furthermore, although the clear circuit 7 is connected to the gated inverter circuit 30 in the present example, similar advantages to the present example may also be achieved by respectively connecting the clear circuit 7 having the circuit configuration of the present example to the back gate terminals of the PMOSFET 23 and the NMOSFET 25 of the gated inverter circuit 20. Moreover, similar advantages to the present example may also be achieved even when the clear circuit 7 is connected to either one of the transfer gate circuits 45 and 60 shown in FIGS. 14 and 15.

By using the latch circuit 1 according to any of the present examples 1 to 10 as at least one of the master circuit and the slave circuit of the DFF circuit 101 shown in FIG. 1, a clear function-added DFF circuit capable of high-speed transfer may be realized.

Next, a logic circuit according to the present embodiment will be described with reference to FIG. 20. FIG. 20 shows an example of a circuit configuration of a logic circuit 81 according to the present embodiment. As shown in FIG. 20, the logic circuit 81 is provided with a network structure that selects and outputs a plurality (two, according to FIG. 20) of externally inputted external signals D1 and D2. The logic circuit 81 includes: a selection circuit 22 that selects one of a plurality of external signals D1, D2 based on predetermined control signals C, E; a state retaining circuit 14 that inputs a signal outputted from the selection circuit 22 as an input signal, and retains the state of the logical level of an output signal F that is outputted based on the input signal; and a clear circuit 7 that changes the logical level of the input signal to a clear level based on a clear signal (not shown).

The selection circuit 22 includes: a transfer gate circuit 83 connected to an input section 2a to which the external signal D1 is inputted; and an NMOSFET 89 as a switching circuit which is connected to the transfer gate circuit 83. The NMOSFET 89 includes: a source terminal connected to the transfer gate circuit 83; and a gate terminal to which the control signal C is inputted. The NMOSFET 89 is arranged so as to switch output/non-output of the external signal D1 based on the control signal C. In addition, the selection circuit 22 includes an NMOSFET 90 having: a gate terminal to which the control signal E is inputted; a source terminal connected to an input section 2b to which the external signal D2 is inputted; and a drain terminal connected to the drain terminal of the NMOSFET 89.

The transfer gate circuit 83 includes NMOSFETs 85 and 87 connected in parallel. Control signals A and B are respectively inputted to gate terminals of the NMOSFETs 85 and 87. Source terminals of the NMOSFETs 85 and 87 are connected to each other and are connected to the input section 2, while drain terminals thereof are connected to each other and are connected to the source terminal of the NMOSFET 89.

The clear circuit 7 is connected to a back gate terminal of the NMOSFET 89. The clear circuit 7 includes a switch circuit 8 connected to the back gate terminal of the NMOSFET 89. Therefore, the NMOSFET (transistor) 89 as a switching circuit includes a gate terminal to which the control signal C is inputted, and a back gate terminal to which the clear circuit 7 is connected.

The state retaining circuit 14 includes an inverter circuit 91 having: an input terminal connected to the drain terminals of the NMOSFETs 89 and 90; and an output terminal connected to the output section 4 from which an output signal F is outputted. In addition, the state retaining circuit 14 includes a PMOSFET 93 having: a gate terminal connected to the output terminal of the inverter circuit 91; a drain terminal connected to the input terminal of the inverter circuit; and a source terminal connected to the power supply terminal to which a power supply voltage VDD is applied. The state retaining circuit 14 acts to retain the state of the logical level of the output signal F and to ease determination of the logical level. At the logic circuit 81, only the inverter circuit 10 is disposed on the signal path of the state retaining circuit 14 on which is transmitted the inputted input signal that is outputted from the selection circuit 22. With the logic circuit 81, since there is no more need to use a NOR circuit on the like on the signal path in order to clear the output signal F as is the case in the conventional clear function-added D latch circuit 301, the load on the signal path is reduced and high-speed operations are enabled.

Next, operations of the logic circuit according to the present embodiment will be described with reference to FIG. 20. First, a normal operation of the logic circuit 81 will be described. During a normal operation, the switch circuit 8 within the clear circuit 7 is switched to the ground terminal-side based on a clear signal, not shown, and the back gate terminal of the NMOSFET 89 is connected to the ground terminal. When high-level control signals A and B are inputted to the gate terminals of the NMOSFETs 85 and 87, the transfer gate circuit 83 assumes an on-state, and an external signal D1 inputted to the input section 2a is inputted to the selection circuit 22. At the same time, an external signal D2 is also inputted to the selection circuit 22. For instance, when the control signal C is at a high level and the control signal E is at a low level, the NMOSFET 89 assumes an on-state while the NMOSFET assumes an off-state. Therefore, the selection circuit 22 selects the external signal D1 and outputs the same to the state retaining circuit 14. The external signal D1 inputted to the state retaining circuit 14 as an input signal is subjected to 180 degrees-phase inversion at the inverter circuit 91, and is then outputted from the output section 4 as an output signal F.

When the input signal inputted to the state retaining circuit 14 is at a low level and the output signal F is at a high level, since the PMOSFET 93 assumes an off-state, the input terminal of the inverter circuit 91 is disconnected from the power supply terminal. Accordingly, the state retaining circuit 14 retains the output signal F at a high level unless the logical level of the input signal inputted to the state retaining circuit 14 changes. In addition, when the input signal inputted to the state retaining circuit 14 is at a high level and the output signal F is at a low level, since the PMOSFET 93 assumes an on-state, the input terminal of the inverter circuit 91 is connected to the power supply terminal. Accordingly, the state retaining circuit 14 retains the output signal F at a low level unless the logical level of the input signal inputted to the state retaining circuit 14 changes.

Next, a clearing operation of the logic circuit 81 will be described. The logic circuit 81 is capable of clearing the output signal F to a low level. For instance, in the event that a clear signal CLR, not shown, is inputted to the clear circuit 7 when the logical level at the input terminal of the state retaining circuit 14 is at a low level and the logical level of the output signal F is at a high level, the switch circuit 8 is switched from the ground terminal-side to the power supply terminal-side. At the same time, low-level control signals C and E are inputted to the gate terminals of the NMOSFETs 89 and 90, whereby the NMOSFETs 89 and 90 assume off-states.

The clear circuit 7 raises the potential of the input signal at the input terminal of the state retaining circuit 14 above the threshold voltage of the NMOSFET (n-type transistor) of the inverter circuit 91 via the back gate terminal of the NMOSFET 89. Consequently, from the perspective of the inverter circuit 91, since the logical level of the input signal changes to a high level, the inverter circuit 91 outputs a low-level output signal F. In this manner, the output signal F is cleared to a low level. Since the NMOSFETs 89 and 90 are in off-states, the logic circuit 81 is able to clear the output signal F without being depended on by the external signals D1 and D2. Since the NMOSFETs 89 and 90 are in off-states during a clearing operation, the external signals D1 and D2 are not outputted to the drain terminal-sides of the NMOSFETs 89 and 90. Furthermore, although the drain terminal-sides of the NMOSFETs 89 and 90 are undetermined because the NMOSFETs 89 and 90 are in off-states, the logical levels of the drain terminal-sides may be determined by the clear circuit 7.

As described above, according to the present embodiment, the logic circuit 81 includes the clear circuit 7 that changes the logical level of an input signal inputted to the state retaining circuit 14 to a clear level. Consequently, the logic circuit 81 no longer requires a NOR circuit or the like for clearing the output signal F to be disposed on the signal path as is the case with the conventional clear function-added D latch circuit 301, and only the inverter circuit 10 need be disposed. As a result, the load on the signal path of the logic circuit 81 decreases in comparison to the conventional clear function-added D latch circuit 301. Consequently, the logic circuit 81 may be equipped with a clear function without having to increase the load on the high-speed signal path that requires high-speed transfer. Therefore, with the logic circuit 81, logic may be set without impairing high-speed operations.

The present embodiment is not limited to the above embodiment, and various modifications may be made.

In the latch circuit 1 according to the above embodiment, although the clear circuit 7 is connected to either one of the switching circuit 3 and the state retaining circuit 5, the present embodiment is not limited to this arrangement. For example, similar advantages to the above embodiment may be achieved even when the clear circuit 7 is connected to both the switching circuit 3 and the state retaining circuit 5.

In addition, although the clear circuit 7 is arranged to include switch circuits 8a and 8b having CMOS inverter structures in the latch circuit 1 according to example 9 described above and the clear circuit 7 is arranged to include a current sink circuit 12a having a current mirror circuit and also a current supply circuit 12b in the latch circuit 1 according to example 10 described above, the present embodiment is not limited to these arrangements. For instance, the clear circuit 7 may be provided with other configurations as long as voltage or a current can be supplied to a back gate terminal of a predetermined FET.

For purposes of explanation, in the above description, numerous specific details are set forth in order to provide a thorough understanding of the invention. It will be apparent, however, to one skilled in the art that the invention can be practiced without these specific details. In other instances, well-known structures and devices are shown in block diagram form in order to avoid obscuring the invention.

While the invention has been described in conjunction with the specific embodiments thereof, it is evident that many alternatives, modifications, and variations will be apparent to those skilled in the art. Accordingly, embodiments of the invention, as set forth herein, are intended to be illustrative, not limiting. There are changes that may be made without departing from the spirit and scope of the invention.

What is claimed is:

1. A latch circuit comprising:
   a switching circuit having an input for receiving an external signal, for switching between output/non-output based on a predetermined control signal;
   a state retaining circuit for receiving the output of the switching circuit as an input signal thereto, and retaining the state of the logical level of an output signal of the state retaining circuit based on the input signal; and
   a clear circuit for changing the logical level of the input signal to a clear level based on a clear signal,
   wherein the clear circuit clears the logical level of the input signal via at least one of the switching circuit and the state retaining circuit, and
   wherein the switching circuit includes a first transistor having a gate terminal and a back gate terminal, wherein the control signal is applied to the gate terminal, and the clear circuit is connected to the back gate terminal.

2. The latch circuit according to claim 1, further comprising:
   an inverter circuit having a CMOS structure,
   wherein the clear circuit changes the logical level of the input signal to a low level by bringing the potential of the input signal below the threshold voltage of a p-type transistor in the inverter circuit via the back gate terminal, and/or changes the logical level of the input signal to a high level by bringing the potential of the input signal above the threshold voltage of an n-type transistor in the inverter circuit via the back gate terminal.

3. A latch circuit comprising:
   a switching circuit having an input for receiving an external signal, for switching between output/non-output based on a predetermined control signal;

a state retaining circuit for receiving the output of the switching circuit as an input signal thereto, and retaining the state of the logical level of an output signal of the state retaining circuit based on the input signal; and a clear circuit for changing the logical level of the input signal to a clear level based on a clear signal, wherein the clear circuit clears the logical level of the input signal via at least one of the switching circuit and the state retaining circuit, wherein the state retaining circuit includes a retaining path connection/disconnection circuit for switching between connection/disconnection of the state retaining circuit, wherein the output signal of the state retaining circuit is fed back to the input terminal to which the input signal is inputted, and the logical level of the output signal is retained in synchronization with the non-output/output state of the switching circuit based on the predetermined control signal, and wherein the retaining path connection/disconnection circuit including a second transistor having a gate terminal and a back gate terminal, wherein the predetermined control signal is applied to the gate terminal, and the clear circuit is connected to the back gate terminal.

4. The latch circuit according to claim 3, wherein
the clear circuit changes the logical level of the input signal to the clear level when the switching circuit is in the non-output state.

5. The latch circuit according to claim 3, further comprising:

an inverter circuit having a CMOS structure, wherein the clear circuit changes the logical level of the input signal to a low level by taking in current via the back gate terminal so that the potential of the input signal drops below the threshold voltage of a p-type transistor in the inverter circuit, and/or changes the logical level of the input signal to a high level by supplying current via the back gate terminal so that the potential of the input signal rises above the threshold voltage of an n-type transistor in the inverter circuit.

* * * * *